US012572721B2

(12) United States Patent
Rahmani Asl et al.

(10) Patent No.: US 12,572,721 B2
(45) Date of Patent: Mar. 10, 2026

(54) BUILDING PERFORMANCE ANALYSIS (BPA) MACHINE: MACHINE LEARNING TO ACCELERATE BUILDING ENERGY ANALYSIS

(71) Applicant: Autodesk, Inc., San Rafael, CA (US)

(72) Inventors: Mohammad Rahmani Asl, Walnut Creek, CA (US); Zachary Micah Kron, Somerville, MA (US); Varvara Toulkeridou, Cambridge, MA (US); Michael Travis Floyd, El Cerrito, CA (US); Ian Molloy, Chestnut Hill, MA (US); Vishal Vaidhyanathan, Pittsburgh, PA (US); Graceline R. Amour, Somerville, MA (US); Spyridon Ampanavos, Somerville, MA (US)

(73) Assignee: AUTODESK, INC., San Francisco, CA (US)

( * ) Notice: Subject to any disclaimer, the term of this patent is extended or adjusted under 35 U.S.C. 154(b) by 1164 days.

(21) Appl. No.: 17/349,100

(22) Filed: Jun. 16, 2021

(65) Prior Publication Data

US 2022/0156438 A1      May 19, 2022

Related U.S. Application Data

(60) Provisional application No. 63/113,295, filed on Nov. 13, 2020.

(51) Int. Cl.
*G06F 30/27* (2020.01)
*G06F 30/13* (2020.01)
*G06F 30/17* (2020.01)

(52) U.S. Cl.
CPC .............. *G06F 30/27* (2020.01); *G06F 30/13* (2020.01); *G06F 30/17* (2020.01)

(58) Field of Classification Search
CPC .......... G06F 30/27; G06F 30/13; G06F 30/17; G06F 2119/08; Y02P 90/82; G06Q 10/06393; G06Q 50/08
See application file for complete search history.

(56) References Cited

U.S. PATENT DOCUMENTS

| | | | | |
|---|---|---|---|---|
| 2014/0365180 A1 | 12/2014 | Lam et al. | | |
| 2019/0066372 A1 * | 2/2019 | Falk-Wallace | .......... | G06T 11/20 |
| 2020/0134243 A1 | 4/2020 | Vardi et al. | | |

FOREIGN PATENT DOCUMENTS

| | | |
|---|---|---|
| CN | 109073753 | 12/2018 |
| CN | 109635511 | 4/2019 |
| CN | 111259481 | 6/2020 |

OTHER PUBLICATIONS

Jung HC, Kim JS, Heo H. Prediction of building energy consumption using an improved real coded genetic algorithm based least squares support vector machine approach. Energy and buildings. Mar. 1, 2015;90:76-84. (Year: 2015).*

(Continued)

*Primary Examiner* — Eunhee Kim
(74) *Attorney, Agent, or Firm* — Gates & Cooper LLP

(57) ABSTRACT

A method and system generate a building operational performance analysis output. A synthetic data set is generated and includes a set of 3D building conceptual mass geometries. The generating includes identifying geometry types, dividing the geometry types into categories, and algorithmically generating the mass geometries using a separate workflow for each category using generative design. Analytical models associated with each of the mass geometries are generated. Simulation results are generated for each of the analytical models. A surrogate model is trained based on a set of features extracted from the simulation results using machine learning (ML). The ML iteratively determines the set of features based on a measured accuracy of the surrogate (Continued)

model. Geometry input is received and processed through the surrogate model to generate the building operational performance analysis output which is then used to inform a designer of an approximate Energy Use Intensity of the geometry input.

28 Claims, 21 Drawing Sheets

(56) References Cited

OTHER PUBLICATIONS

Seyedzadeh S, Rahimian FP, Glesk I, Roper M. Machine learning for estimation of building energy consumption and performance: a review. Visualization in Engineering. Dec. 2018;6:1-20. (Year: 2018).*

Ascione F, Bianco N, De Stasio C, Mauro GM, Vanoli GP. Artificial neural networks to predict energy performance and retrofit scenarios for any member of a building category: A novel approach. Energy. Jan. 1, 2017;118:999-1017. (Year: 2017).*

Hong SM, Paterson G, Burman E, Steadman P, Mumovic D. A comparative study of benchmarking approaches for non-domestic buildings: Part 1—Top-down approach. International Journal of Sustainable Built Environment. Dec. 1, 2013;2(2):119-30. (Year: 2013).*

Extended European Search Report dated Apr. 20, 2022 for European Patent Application No. 21207430.6.

Nazir, A., et al., "Evaluating Energy Efficiency of Buildings using Artificial Neural Networks and K-means Clustering Techniques", 2020 3rd International Conference on Computing, Mathematics and Engineering Technologies (ICOMET), IEEE, Jan. 2020, pp. 1-7.

Perera, A.T.D., et al., "Machine learning methods to assist energy system optimization". Applied Energy, 2019, pp. 191-205, vol. 243.

Lin, Y., et al., "An ANN-exhaustive-listing method for optimization of multiple building shapes and envelope properties with maximum thermal performance", Frontiers in Energy, Jan. 2019, pp. 550-563, vol. 15, No. 2.

Seyedzadeh, S., et al., "Machine learning for estimation of building energy consumption and performance: a review", Visualization in Engineering, Oct. 2018, pp. 1-20, vol. 6, No. 5.

Chinese Office Action (with English translation) dated Mar. 28, 2025 for Chinese Patent Application No. 2021112313492.

Touran, N.W., et al., "Computational Tools for the Integrated Design of Advanced Nuclear Reactors", Engineering, 2017, pp. 518-526.

Response to Chinese Telephone Notification as filed Aug. 26, 2025 with pending claims.

European Examination Report dated Dec. 9, 2025 for European Patent Application No. 21207430.6.

Tsanas, A., et al., "Accurate quantitative estimation of energy performance of residential buildings using statistical machine learning tools", Energy An Buildings, Mar. 2012, pp. 560-567, Vol. 49.

* cited by examiner

304 →

302 →

304 →

302 →

304 →

302 →

CREATE MINIMUM BOUNDING BOX — 1602

CALCULATE SOUTH AND EAST FACING SURFACE OF BOUNDING BOX — 1604

CALCULATE SOUTH-FACING INDEX — 1606

$(X_{min}, Y_{max})$    $(X_{max}, Y_{max})$

1702

1704

$(X_{min}, Y_{min})$    $(X_{max}, Y_{min})$

1808

1804

1802

1806

BUILDING PERFORMANCE ANALYSIS (BPA) MACHINE: MACHINE LEARNING TO ACCELERATE BUILDING ENERGY ANALYSIS

CROSS-REFERENCE TO RELATED APPLICATIONS

This application claims the benefit under 35 U.S.C. Section 119(e) of the following commonly-assigned U.S. provisional patent application(s), which is/are incorporated by reference herein:

Provisional Application Ser. No. 63/113,295 filed on Nov. 13, 2020, with inventor(s) Mohammad Rahmani Asl, Zachary Micah Kron, Varvara Toulkeridou, Michael Travis Floyd, Ian Molloy, Vishal Vaidhyanathan, Graceline R. Amour, and Spyridon Ampanavos, entitled "Building Performance Analysis (BPA) Machine: Machine Learning to Accelerate Building Energy Analysis,".

BACKGROUND OF THE INVENTION

1. Field of the Invention

The present invention relates generally to building analysis, and in particular, to a method, apparatus, system, and article of manufacture for accelerating building energy performance analysis using machine learning at an early-design phase.

2. Description of the Related Art

Research has shown that buildings are responsible for 40% of carbon emissions. By performing simulations of the suspected manner that a building consumes energy (in an accurate manner) allows designers to reduce the energy a building will consume. Further, if such simulations can be performed in an early stage, architects and designers can make decisions that can be used to affect subsequent design decisions. Accordingly, it is desirable to analyze the operational building energy performance including during the early-design phase in an automated manner. More specifically, it is desirable to leverage generative design to create synthetic data that can be used to train a surrogate model to automate some form of building performance analysis (i.e., energy) at an early stage of the design process in an accurate matter. However, building energy analysis is a computationally intensive process for which the processing time introduces a lag between the analysis and the design workflow. As a result, while various building performance analysis tools exist (e.g., AUTODESK INSIGHT), such tools are computationally expensive, fail to provide real-time energy feedback, do not utilize generative design, and cannot be used during the early stage of energy analysis. Thus, embodiments of the invention solve the problem of accelerating operational building energy performance analysis (and/or other building data analysis) with machine learning at the early-design phase. While there are previous studies that discuss the possibility of using machine learning for predictive energy analysis, none of them address the actual form or geometry of the building mass. This renders it impossible to use predictive methods for real-time impact assessment as a metric of design assistance.

Prior art systems have attempted to solve early-design phase energy analysis issues with simple datasets, but none have addressed the issue of the building geometries and their form themselves. The previous studies work only for a given building form and climate zone, whereas embodiments of the invention can predict the energy use for any given building form and potentially any number of climate zones at the early-design phase in real-time. This has not been addressed in previous studies. In addition, prior art systems fail to provide the capability to analyze other types of building data (e.g., solar, daylighting, thermal comfort, embodied carbon, structural analysis, construction cost, constructability, windflow analysis (computational fluid dynamics), photovoltaic potential, building program requirements, construction scheduling, construction work progress analysis and prediction, crowd simulation and shortest path finding, model of fire and smoke transport, etc.

Further, the use of generative design and other automated workflows for creating a comprehensive synthetic dataset, and a surrogate model whose architecture is attuned to work with and learn from the synthetic dataset has not been done and addressed before.

SUMMARY OF THE INVENTION

Embodiments of the invention create a real-time operational energy prediction service at the early-design phase through the method of synthetic dataset generation to train a custom-built surrogate model architecture, reducing time and computation of current simulations drastically, and facilitating the integration of real-time energy/data evaluation in the geometric modeling environment (e.g., the AUTODESK REVIT Application or the AUTODESK FORMIT application) and parametric environments (e.g., the DYNAMO visual programming environment), for utilizing real-time energy use (or other data) as a metric for design direction and selection. Embodiments of the invention also enable using real-time energy (or other data) prediction as an objective function for Generative Design studies, allowing users to generate multiple design options (with the form, and other building parameters) with the energy use (or other data) as a decision metric.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Embodiments of the invention utilize two (2) phases to enable accurate energy performance analysis: (1) Phase 1—Synthetic Dataset Generation (i.e., generating data that will support a machine learning (ML) model); and (2) Phase 2—Surrogate/Machine Learning Model Creation. Details for each of these phases will be described below.

Phase 1

This phase of the work comprises the methodology and subsequent framework to utilize an automated process such as Generative Design (e.g., in the AUTODESK REVIT application) and other computational methodologies to generate Synthetic Datasets emulating buildings—geometry data, as well as their corresponding analytical data (energy-use, energy settings etc.). This data set is to be used to train a surrogate model (i.e., in Phase 2) to create a real-time (energy) prediction service, reducing time and computation of current simulations, and facilitating the integration of building (energy) evaluation in the geometric modeling environment.

Objectives

The objectives in Phase 1 include one or more of the following:

Creating a comprehensive dataset that is morphologically diverse (and representative of an array of masses [and contains corresponding analytical values), capable of training machine learning (ML) models to recognize any 3D geometry.

Create an automated workflow framework/process to generate reusable synthetic datasets (that avoids duplicate geometries and morphology biases) that can be used for future research.

Develop a workflow that is parametric, enabling control and modification of the type and content of generated datasets.

Utilize and Demonstrate the power of Generative Design, for executing such workflows.

Requirement Analysis/Dataset Constituents

The initial development stage (in meeting the above-identified objectives) involved a requirement analysis. It was essential to identify—for the given objectives—what the output synthetic dataset should comprise of, to render it capable of training the surrogate model. once the required constituents are identified, a generative workflow for each of the constituents can be identified and developed.

Figure 1A:
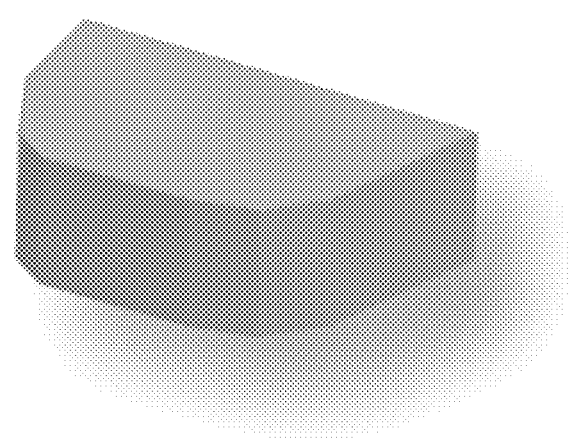
FIG. 1A illustrates an exemplary 3D geometry mesh in accordance with one or more embodiments of the invention.

The above objectives initially serve to identify the kind/type of synthetic dataset to be generated. Identified constituents of the dataset were then linked to a suitable data type that would be efficient to generate automatically, as well as be easily parsed and handled. The data types were also decided based on the nature of Tools or Services used to generate them. It was identified that the following components may be essential to build the dataset:

(1) a diverse set of 3D conceptual building masses (meshes) (capable of being representative of ANY unseen conceptual mass. The 3D geometries were generated (e.g., using any conceptual building mass generator) and compiled in the form of meshes, with the *.obj format. FIG. 1A illustrates an exemplary 3D geometry mesh in accordance with one or more embodiments of the invention.

Figure 1B:
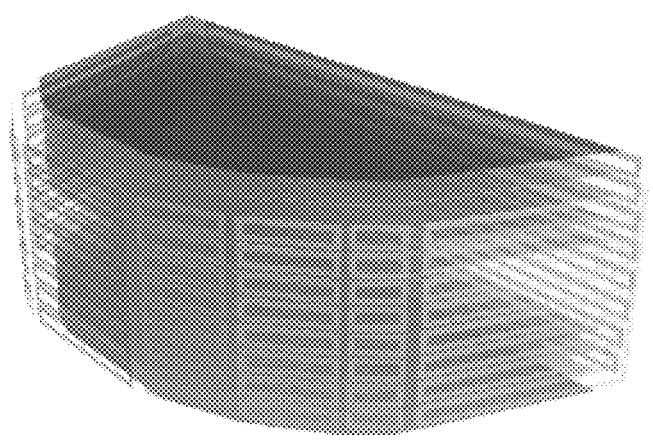
FIG. 1B illustrates an associated analytical model of each of the meshes created using default energy settings as a base-case and compiled in the form of gbxml files.

(2) associated energy models of these conceptual building masses (gbxml) (e.g., using an intrinsic energy model maker). FIG. 1B illustrates an associated analytical model of each of the meshes created using default energy settings as a base-case and compiled in the form of gbxml files.

(3) energy simulation results (i.e., energy use results) of these energy models (post full building energy simulation (FBES)) (e.g., using an automated simulator and result extractor). In an exemplary embodiment, the analytical models are sent to s simulator (e.g., AUTODESK GREEN BUILDING STUDIO simulator) with the simulation results saved and compiled in the form of a CSV (comma separated value) file.

Once the requirements were established, the next step was to identify the overall workflow model that would combine several individual sub-workflows together to generate and compile the identified data in the required format. The sub-workflows here are the individual methods to generate each of the required data types, or to interface between different tools/services to do the same.

Workflow Development

Figure 2:
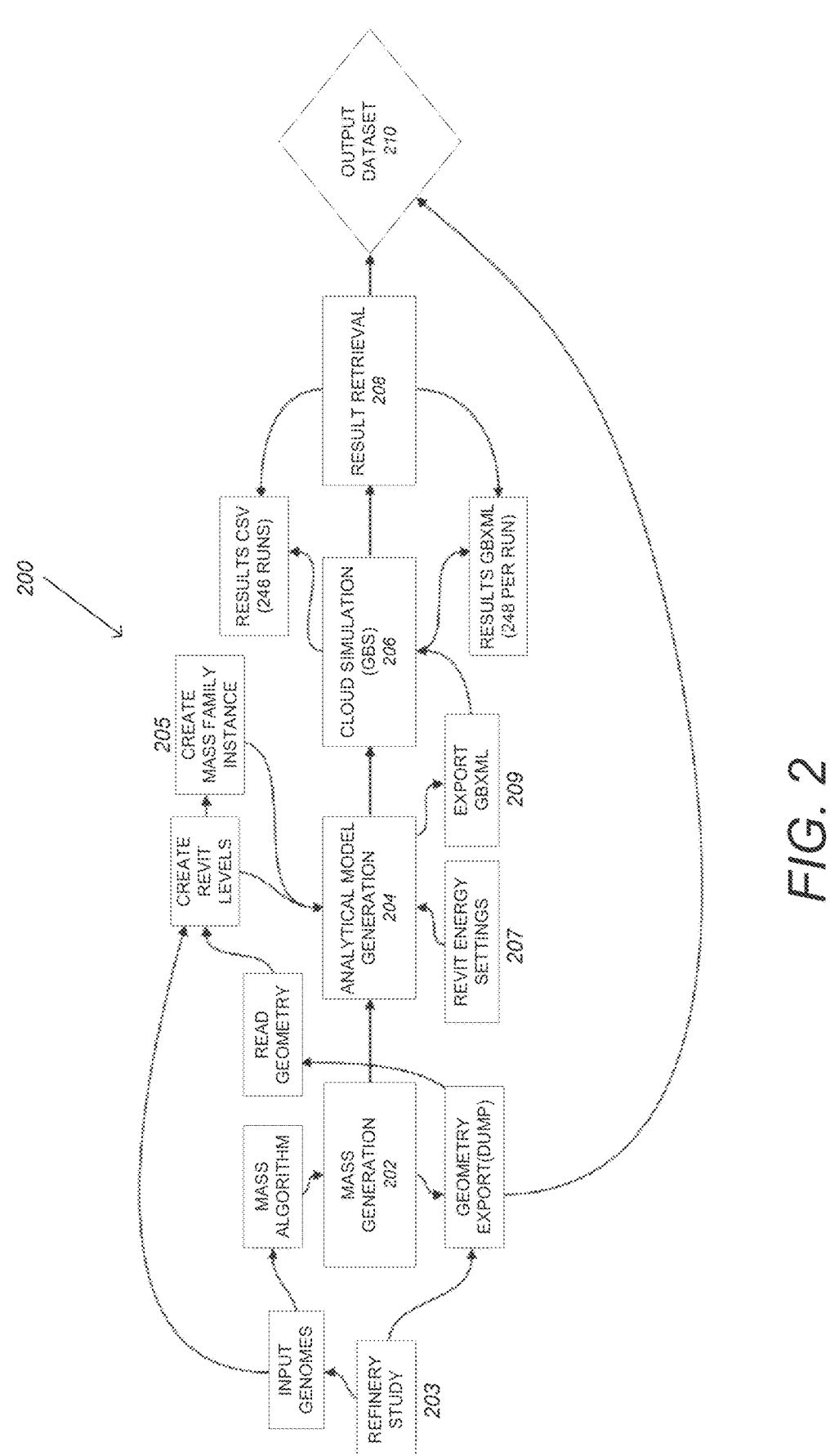
FIG. 2 illustrates the overall workflow for performing a building energy analysis in accordance with one or more embodiments of the invention.

FIG. 2 illustrates the overall workflow for performing a building energy analysis in accordance with one or more embodiments of the invention. The overall workflow 200 begins with a mass generation workflow 202 that contains several sub workflows (as discussed in later sections) to generate masses of diverse morphologies. This stage utilizes the power of Generative Design (e.g., AUTODESK GENERATIVE DESIGN for REVIT also referred to in FIG. 2 as REFINERY/REFINERY STUDY 203) to generate the geometry masses. The masses generated are then converted to (REVIT MASS) family instances 205.

In analytical model generation workflow 204, the mass family instances 205 are converted to analytical models with various energy settings 207 (e.g., default energy settings extracted from the REVIT application)(i.e., exported as GMXML files 209).

In cloud simulation workflow 206, a cloud simulation engine (e.g., the AUTODESK GREEN BUILDING STUDIO (GB S) simulator) is used to calculate the energy use of the generated geometries. The analytical model of the masses are pushed to the simulator for energy simulation, and in workflow 208, the results are retrieved to form the complete synthetic output dataset 210. This process is explained in detail below.

Considering the future flexibility of the workflow 200, the different parts of the workflow are broken down into modular parts, that can be plugged in with other modules in the future, for several studies. This would ensure the flexibility and re-usability of the workflow 200 in whole are in parts for future research and studies.

Mass Generation Workflow 202

Figure 3:
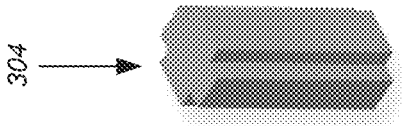
FIG. 3 illustrates a correlation between given buildings and massing in accordance with one or more embodiments of the invention.
Figure 3:
Figure 3:
Figure 3:
Figure 3:
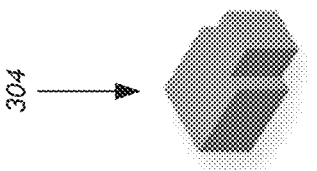
Figure 3:
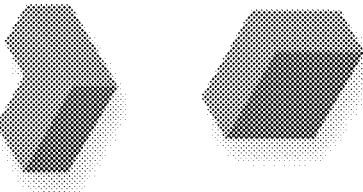
Figure 3:
Figure 3:
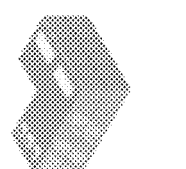
Figure 3:
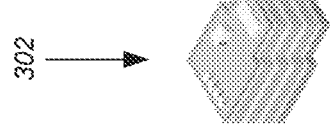
Figure 3:
Figure 3:
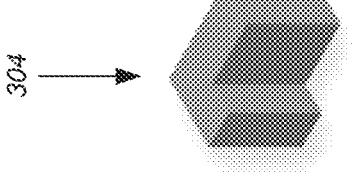
Figure 3:
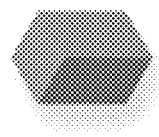
Figure 3:
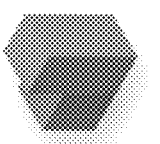
Figure 3:
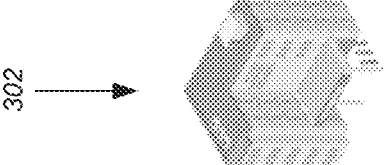
Figure 3:
Figure 3:
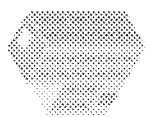

The mass generation workflow 202 consists of a systematic method to generate massing forms, aimed at generating an all-encompassing sample set of conceptual masses. The initial step in developing this workflow 202 is to identify what kind of geometry types are to be generated. In order to do this, an initial correlational study is done to identify the overarching type/detail of the target geometries for the given problem set at hand. FIG. 3 illustrates a correlation between given buildings and massing in accordance with one or more embodiments of the invention. As illustrated, there is a correlation for any given building 302 with the massing 304 at the conceptual stage/the associated thermal model for the given stage of intervention (early-phase design). It was possible to represent any building 302 as a simple mass 304 at its early-design phase and for its thermal model.

In embodiments of the invention, it may also be necessary to establish how diversity can be maintained to ensure robust training, and to avoid duplication of geometry morphologies to ensure an unbiased training dataset. To achieve this, the target geometry morphologies may be divided into categories on two fronts: The Footprint (X and Y axes) and the Massing (Z axis). Categorization as such would allow development of generator algorithms easier, through a divide and conquer method.

Figure 4:
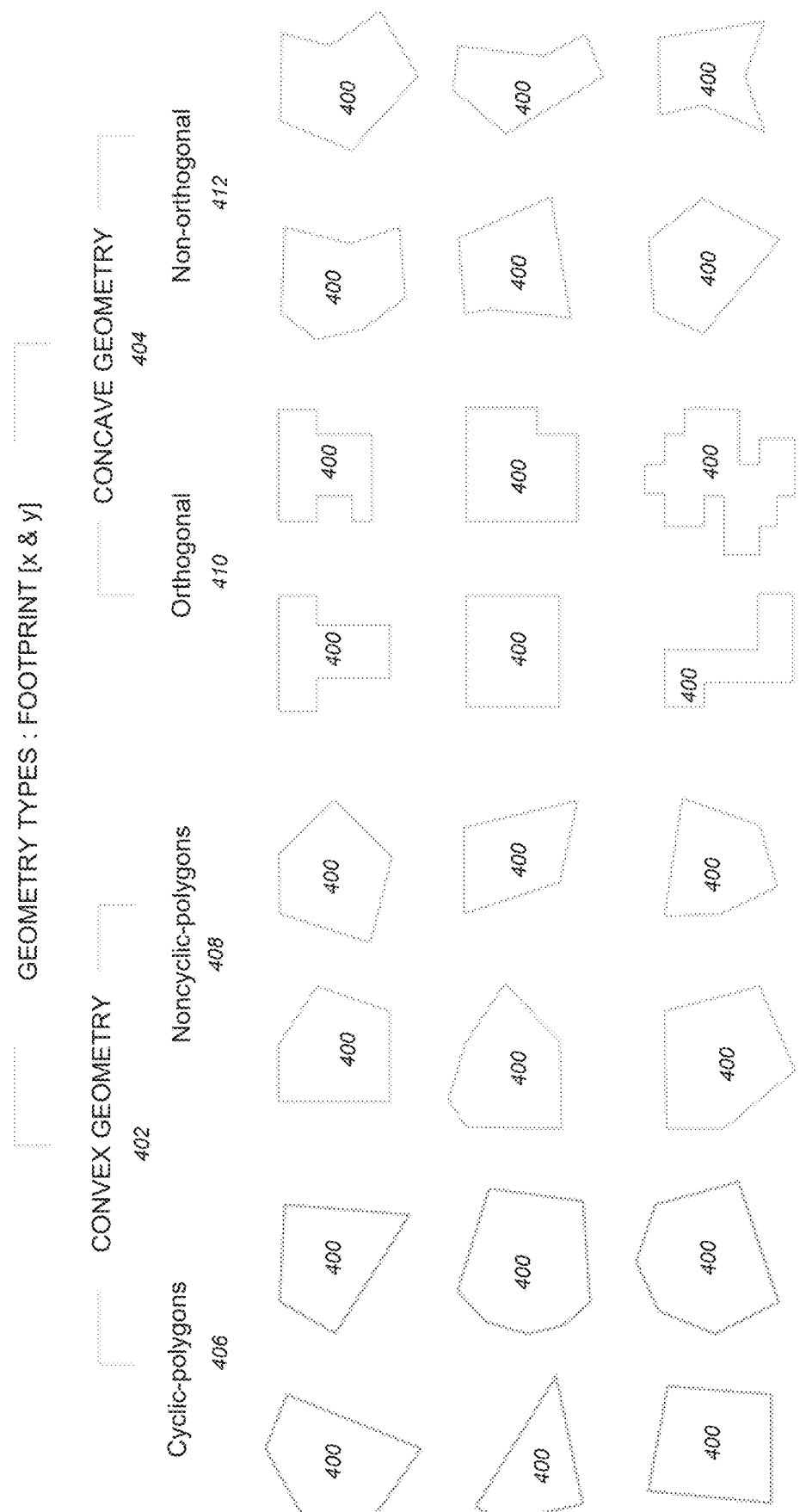
FIG. 4 illustrates the categorization at the footprint level in accordance with one or more embodiments of the invention.

Keeping the target diversity in mind, the geometries to be generated may be categorized at the footprint and massing level. FIG. 4 illustrates the categorization at the footprint level in accordance with one or more embodiments of the invention. As illustrated, the footprints 400 are categorized into convex geometry 402 and concave geometry 404. The convex geometry is further categorized into cyclic-polygons 406 and noncyclic polygons 408. The concave geometry 404 is further categorized into orthogonal 410 and non-orthogonal 412 geometry types.

Figure 5:
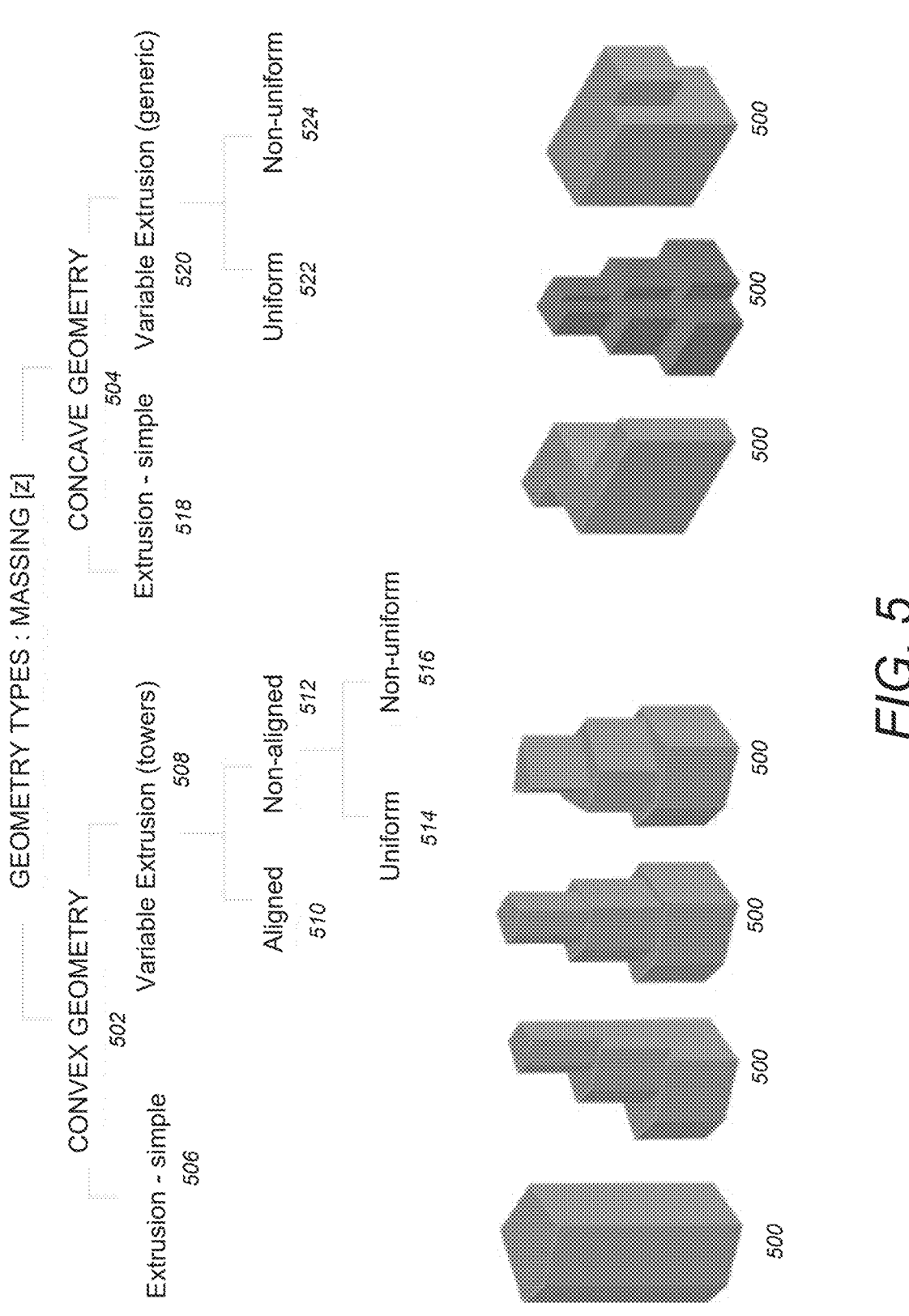
FIG. 5 illustrates the categorization at the massing level in accordance with one or more embodiments of the invention.

FIG. 5 illustrates the categorization at the massing level in accordance with one or more embodiments of the invention. As illustrated, the massing geometry types 500 are categorized into convex geometry 502 and concave geometry 504. The convex geometry masses are further categorized into extrusion-simple 506 and variable extrusion (towers) 508. The variable extrusion (towers) 508 are further categorized into aligned 510 and non-aligned 512, which may be uniform 514 or non-uniform 516. The concave geometry 504 may be further categorized as extrusion-simple 518, or variable extrusion (generic) 520, which may be uniform 522 or non-uniform 524.

The categorizations illustrated in FIGS. 4 and 5 were developed based on trial and error testing. Further, twenty-five (25) random 3D masses were manually tested, and it was identified that all of them fell under one of the above-mentioned categories. Accordingly, this renders it possible to represent ANY 3D conceptual mass with these categories. Once the categories were decided, each of the categories may be broken down algorithmically into generator sub-workflows. These sub-workflows each generate sample geometries pertaining to a particular category.

Cyclic Polygons Convex Geometry Subworkflow

Figures 6, 7:
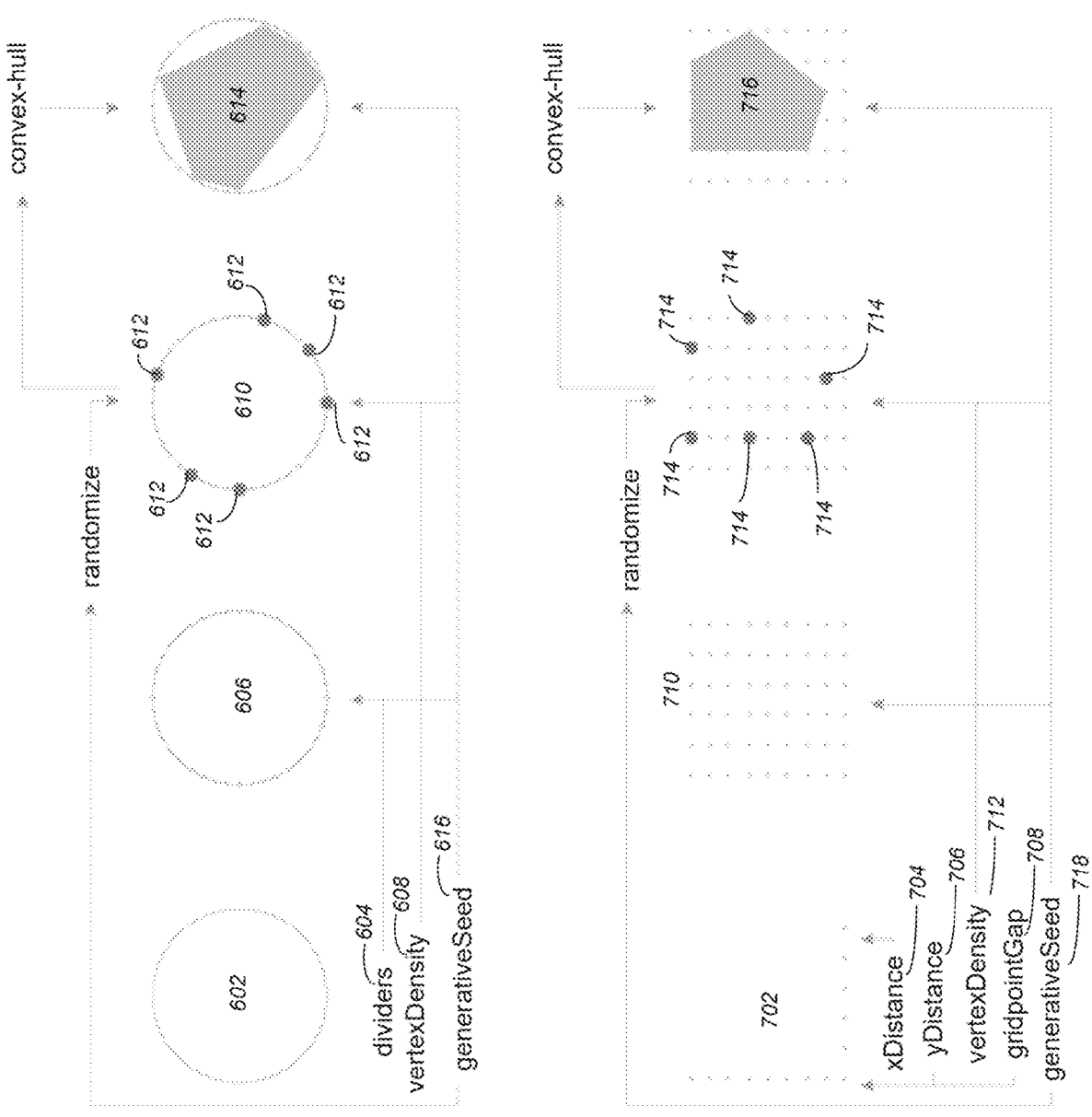
FIG. 6 illustrates the logical flow for generating convex geometry for cyclic-polygons in accordance with one or more embodiments of the invention.
FIG. 7 illustrates the logical flow for generating geometry for noncyclic convex polygons in accordance with one or more embodiments of the invention.

FIG. 6 illustrates the logical flow for generating convex geometry for cyclic-polygons in accordance with one or more embodiments of the invention.

In the first step, a footprint guiding circle 602 is generated. This circle 602 has its radius and position as parametric variables. These variables in turn decide the position and the scale of the overall generated geometry.

The guiding circle 602 is then divided into a number of "dividers" 604 which is dependent on user-input. The dividers 604 decide the overall number of vertices of the geometry—the greater the number, the more the vertices for the geometry, which means it can range from curved geometry to jagged geometry. Divided circle 606 illustrates the guiding circle 602 with the dividers 604.

A user input value called vertexDensity 608 decides what percentage of dividers 604 are chosen as vertices. The double layer to decide the number of vertices is to prevent duplicity and monotony in the geometries generated. Just like the dividers 604, the vertexDensity 608 decides the overall number of vertices of the geometry—the greater the number, the more the vertices for the geometry, which means it can range from curved geometry to jagged geometry. In one or more embodiments, the vertexDensity 608 is a number between 0 and 1 where 0 means no points are selected and 1 means all points are selected. Circle 610 illustrates the divided circle 606 with the vertices 612 that have been selected based on the vertexDensity 608.

With these vertices 612, a convex hull 614 of these points gives the final output footprint for this category. In addition, it may be noted that the variables (dividers 604, vertexDensity 608), may be randomized (as part of an automated workflow) to generate many different options. Further, the generativeSeed 616 variable creates a new value (e.g., randomized) for every iteration of generating the cyclic convex geometry/polygons.

Noncyclic Polygons Convex Geometry Subworkflow

FIG. 7 illustrates the logical flow for generating geometry for noncyclic convex polygons in accordance with one or more embodiments of the invention.

Instead of the footprint guiding circle 602 of FIG. 6, a point-grid 702 is used for this purpose. It has the xDistance 704 and yDistance 706 variables that decide the number of points on the X and Y directions of the grid 702. The gridpointGap variable 708 decides the gap between the points in the grid 710. These three variables 704-708 together decide the overall scale, and the aspect ratio of the generated output mass.

A user input value called vertexDensity 712 decides what percentage of gridPoints are chosen as vertices 714. In other words, the vertexDensity 710 decides the overall number of vertices of the geometry—the greater the number, the more the vertices for the geometry, which means it can range from curved geometry to jagged geometry.

With these vertices 714, a convex hull of these points gives the final output footprint 716 for this category. Similar to the cyclic polygons described in FIG. 6, the variables (xDistance 704, yDistance 706, gridpointGap 708, and vertexDensity 712) may be randomized (as part of an automated workflow) to generate many different options. Further, the generativeSeed 718 variable creates a new value (e.g., randomized) for every iteration of generating the non-cyclic convex geometry/polygons.

Orthogonal Polygon Concave Geometry Subworkflow

Figure 8:
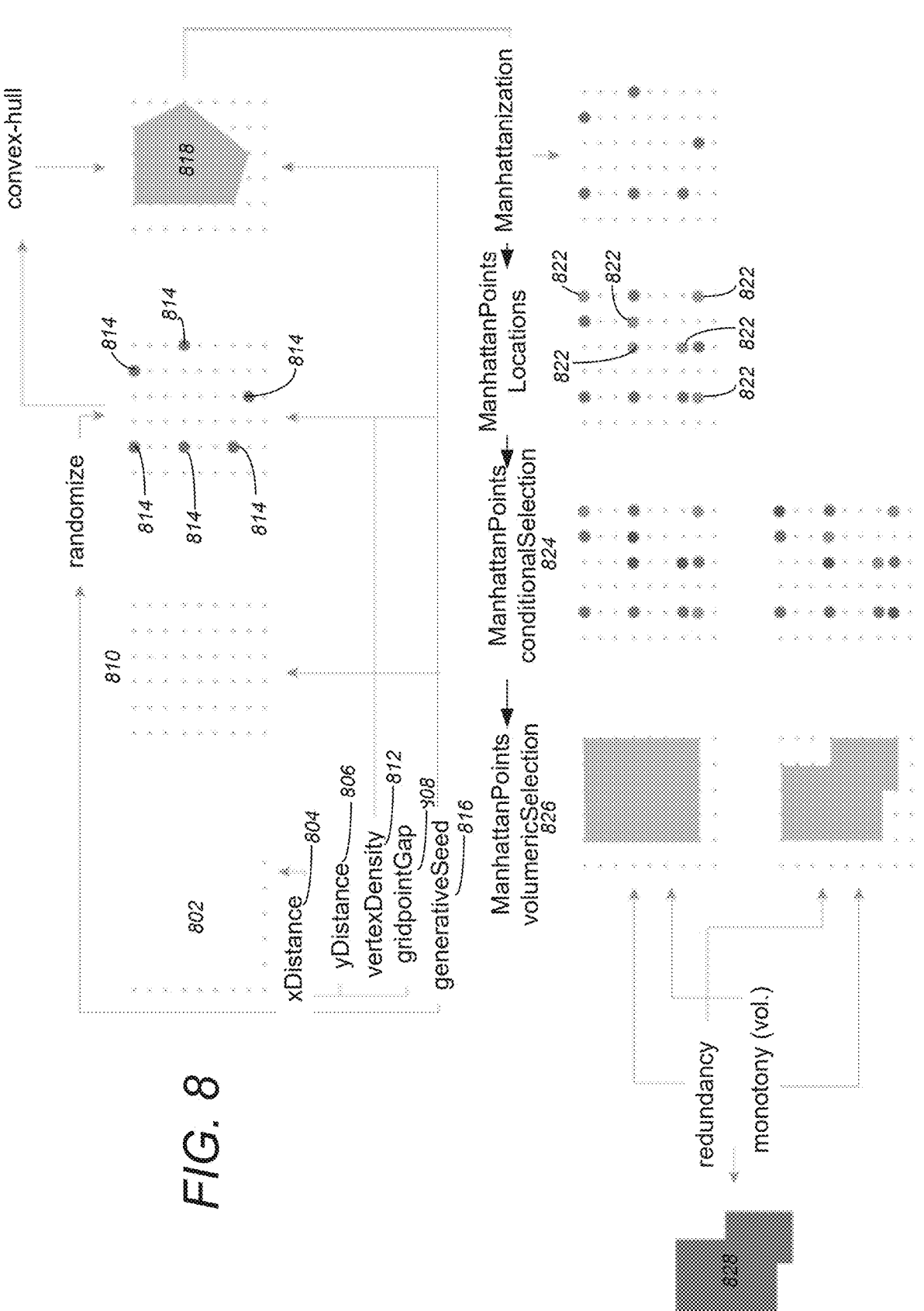
FIG. 8 illustrates the logical flow for generating orthogonal concave polygons in accordance with one or more embodiments of the invention.

FIG. 8 illustrates the logical flow for generating orthogonal concave polygons in accordance with one or more embodiments of the invention.

A point-grid 802 has the xSize 804 and ySize 806 variables that decide the number of points on the X and Y directions of the grid 802. The gridpointGap 808 variable decides the gap between the points in the grid 802. These three variables 804-808 together decide the overall scale, and the aspect ratio of the generated output mass (as reflected in the full grid 810.

A user input value called vertexDensity 812 decides what percentage of gridPoints are chosen as vertices. Thus, the vertexDensity 812 decides the overall number of vertices of the geometry—the greater the number, the more the vertices for the geometry, which means it can range from curved concave geometry to jagged concave geometry. The vertices that have been selected (e.g., a new set of vertices may be selected each iteration based on a generativeSeed 816 that may randomize the variable values) are illustrated as vertices 814.

With these vertices 814, a convex hull 818 of the points gives the base convex footprint for this category.

With the base convex footprint, a method called Manhattanization 820 is used to generate the concave polygon. The Manhattanization process 820 is as follows:

An iterator begins at the first vertex 814 of the base convex geometry, and traverses from one vertex 814 to the next.

The process checks if the next immediate vertex is linearly displaced or obliquely displaced. If linear, the process goes to the next vertex 814. If not, an additional "Manhattan Point" 822 is added, which is a point that is the intersection of linear extensions of the current point and the next point. This joins the current point with the next point in an orthogonal way, instead of a slant/oblique way.

Once all manhattan points 822 are added, all points (814 and 820) are joined together with a closed PolyCurve.

In addition to the Manhattanization 820, two additional helper functions (conditional Selection 824 and volumericSelection 826) may be added to ensure that there are no backtracking lines (repeating Manhattan points as two points might have the same manhattan point 822) and also to ensure the generation of interesting concave shapes (avoiding monotony by choosing the interesting alternative of geometry generated and avoiding duplicate/redundant geometry [e.g., a box/rectangle]).

As a result of the above steps, the final footprint 828 of this category is generated.

Non-Orthogonal Polygon Concave Geometry Subworkflow

Figure 9:
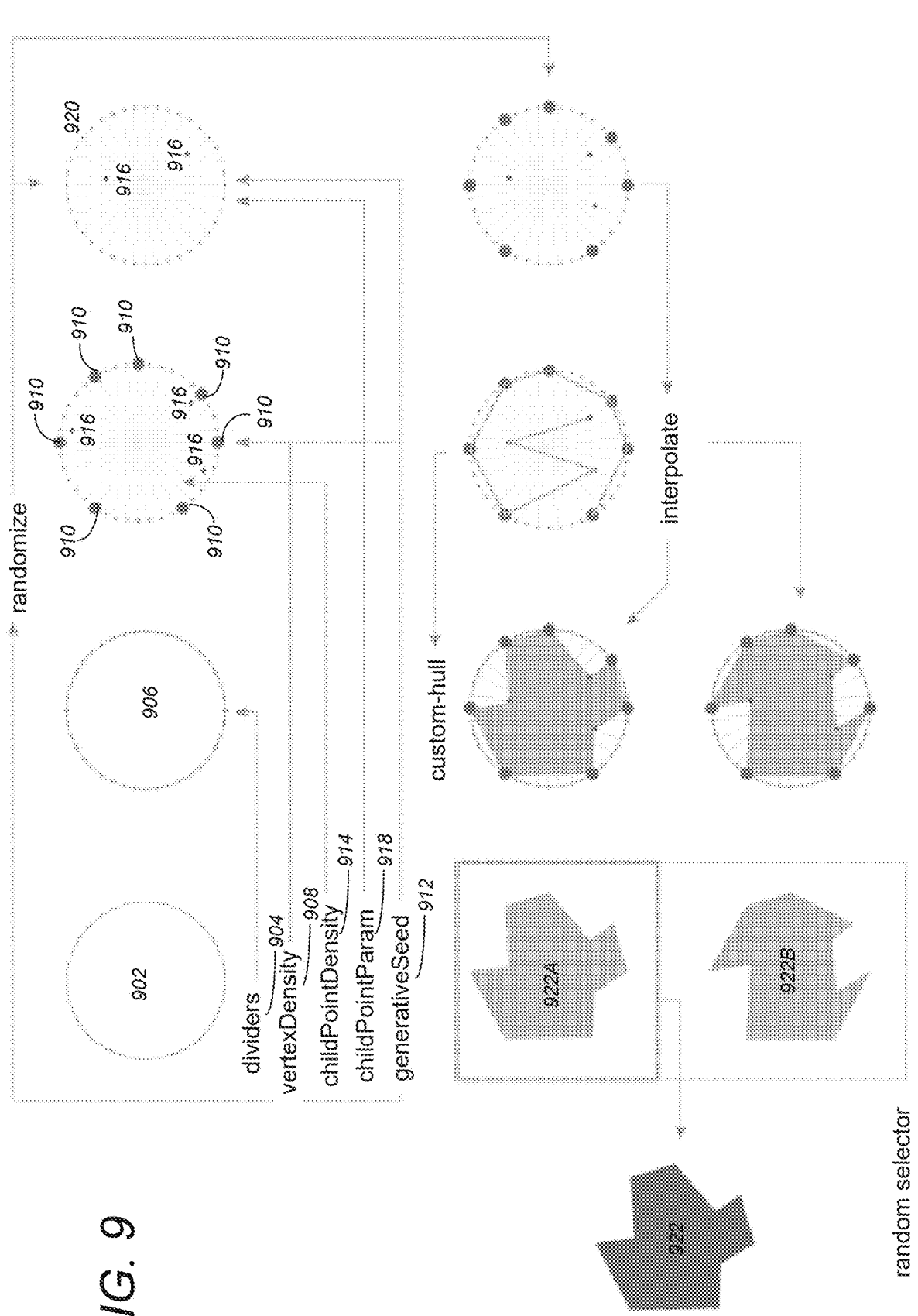
FIG. 9 illustrates the logical flow for generating non-orthogonal concave geometry in accordance with one or more embodiments of the invention.

FIG. 9 illustrates the logical flow for generating non-orthogonal concave geometry in accordance with one or more embodiments of the invention. Such non-orthogonal concave geometries may be added to enhance the overall geometric diversity of the dataset, as these—while they might not resemble actual building forms—are complex geometry that would improve the training process of the target surrogate model, and make the geometry dataset wholesome and all-encompassing. They can be removed or modified as per need.

A footprint guiding circle 902 is added. This circle 902 has its radius and its position as parametric variables. These variables decide the position and the scale of the overall generated geometry.

The guiding circle 902 is then divided into a number of "dividers" 904 (resulting in divided circle 906) which is dependent on user-input. The dividers 904 decide the overall number of vertices of the geometry—the greater the number, the more the vertices for the geometry, which means it can range from curved geometry to jagged geometry.

A user input value called vertexDensity 908 decides what percentage of dividers are chosen as selected vertices 910. The double layer to decide the number of selected vertices 910 is to prevent duplicity and monotony in the geometries generated. Just like the dividers 904, the vertexDensity 908 decides the overall number of vertices of the geometry—the greater the number, the more vertices for the geometry, which means it can range from curved geometry to jagged geometry.

Once the selected vertices 910 are chosen at random based on the input vertexDensity 908 (e.g., based on a random generation of values by the generativeSeed 912 each iteration), a new user-input variable called the childPointDensity 914 determines what percentage of these selected vertices 910 should be extrapolated to sub-points 916. Sub-points 916 are extensions of vertex points to the interior of the guiding circle 902.

Once the child/sub points 916 are decided, a final variable called the childPointParam 918 determines how much the child point 916 is extended from the parent vertex point. It is a value that ranges from 0 to 1, 0 being the vertex point itself and 1 being the center of the circle 902. The final resulting child/sub points 916 in the extended locations are illustrated in circle 920.

With all the vertex 910 and child points 916, a PolyCurve is drawn (e.g., via interpolation) in order to generate the final footprint 922 for this category. As illustrated in FIG. 9, various different footprints 922A and 922B may be interpolated/generated with one footprint 922A randomly selected as the final footprint 922.

Generative Design v. Mass Generator Interfacing

In view of the above, each category has an algorithm used to generate geometries using generator variables (that are used to generate a seed for each iteration) and modifier variables (i.e., that modify the geometry itself). In this manner, a synthetic data set may be generative using generative design techniques (e.g., that smartly manipulates variables to satisfy certain objective functions). Thus, different solvers within a generative design product (e.g., within the AUTODESK GENERATIVE DESIGN for REVIT application also referred to in FIG. 2 as REFINERY 203) may be used to create synthetic data sets for different use cases. In this regard, an objective of embodiments of the invention is to utilize the power of generative design to generate the masses and control the type of generated masses. To do this, it was important to ensure that the above-mentioned mass generator sub-workflows work with the format that generative design applications accept. This way, the mass generator algorithms can be used in tandem with the powerful functions of generative design applications to not only generate random geometry samples, but also have powerful control over them to attune the generated geometry to specific needs and typologies.

Figure 10:
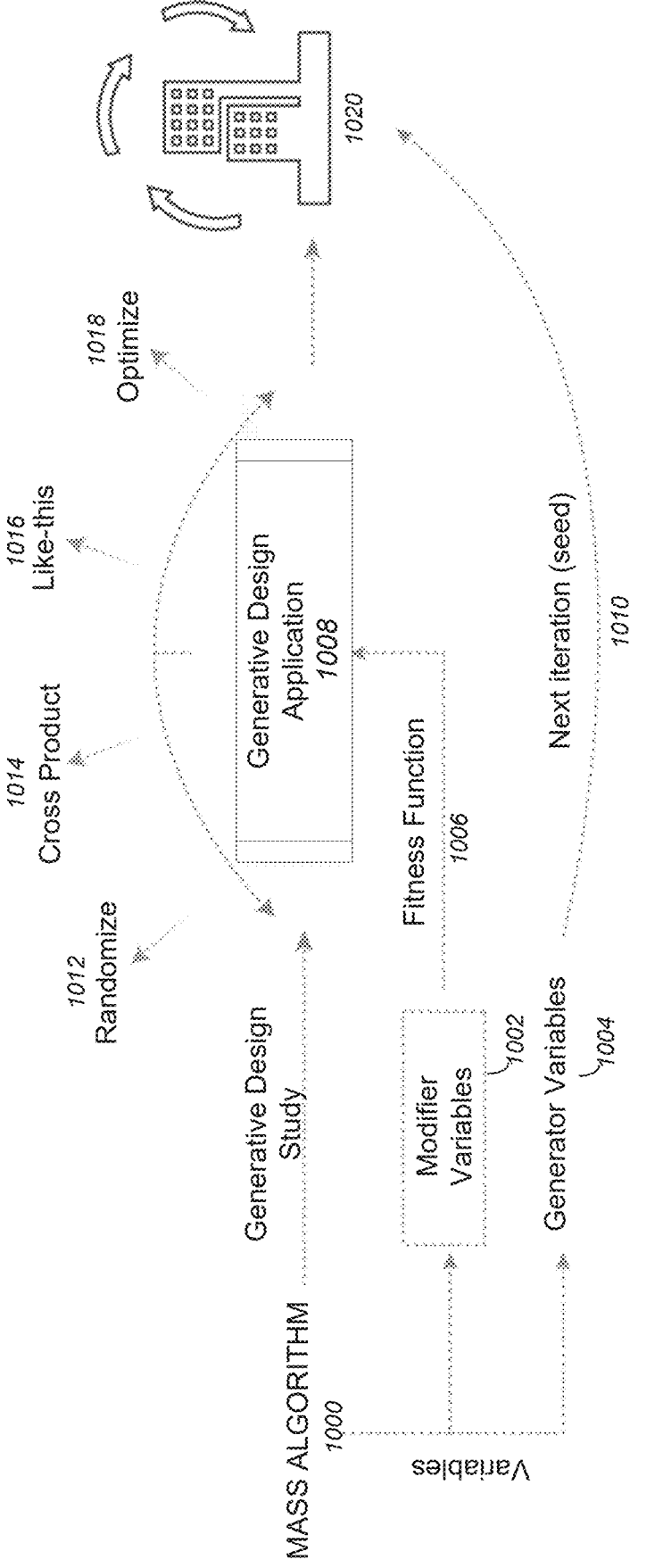
FIG. 10 illustrates the framework for utilizing generative design applications to generate synthetic data in accordance with one or more embodiments of the invention.

To provide such capabilities, the framework illustrated in FIG. 10 was used. More specifically, FIG. 10 illustrates the framework for utilizing generative design applications to generate synthetic data in accordance with one or more embodiments of the invention. The different variables of the mass generator 1000 sub-workflows were developed in such a way that they serve one of the two functions:

Modifiers 1002

Generators 1004

The Modifiers 1002 are those variables that change the nature and shape of the geometry and set the "base case" for the generation (i.e., are used by a fitness function 1006 within the generative design application 1008. The Generators 1004 are those variables that vary the base case geometry into different samples and generate a new (but same category) geometry 1020 (i.e., can be used as a seen for each iteration 1010 of the category subworkflows). The generators 1004 can be manipulated using one of the four functions (e.g., randomize 1012, cross-product 1014, like-this 1016, and optimize 1018) that generative design applications 1006 may offer, to control the geometry generation to specific tasks and pipelines. Different purposes can use different functions of generative design 1006 to generate the target dataset attuned to the function.

Figure 11:
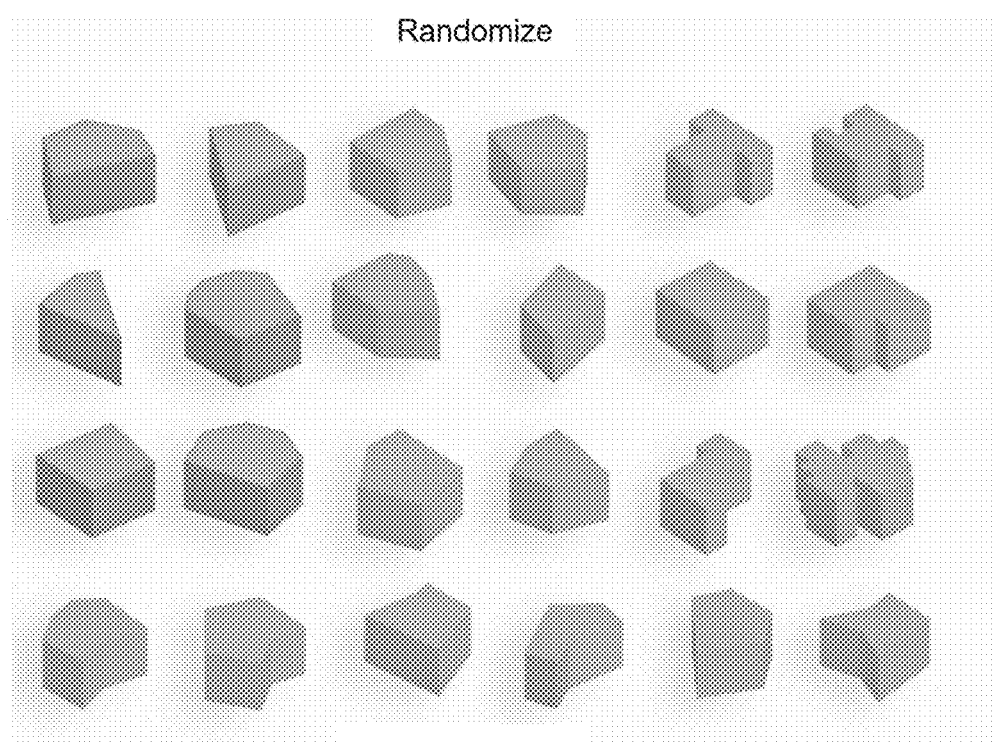
FIG. 11 illustrates exemplary reusable synthetic dataset geometries created using the randomize function in accordance with one or more embodiments of the invention.
Figure 12:
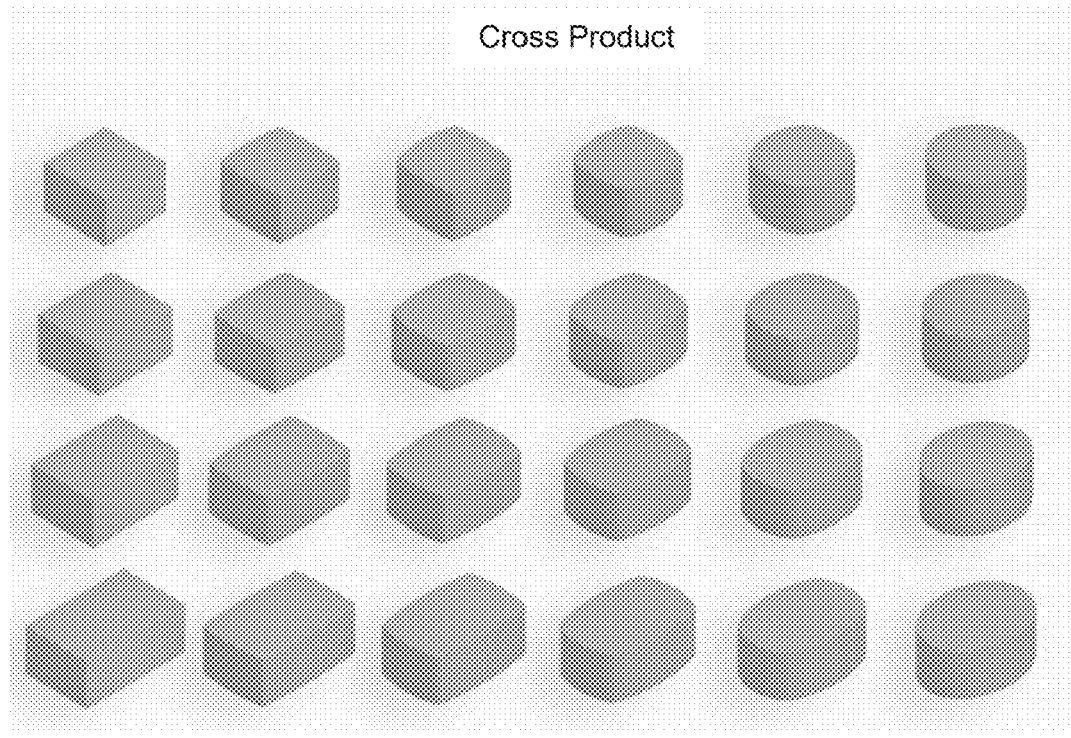
FIG. 12 illustrates exemplary combinatorial analysis/feature search dataset geometries created using the randomize cross product function in accordance with one or more embodiments of the invention.
Figure 13:
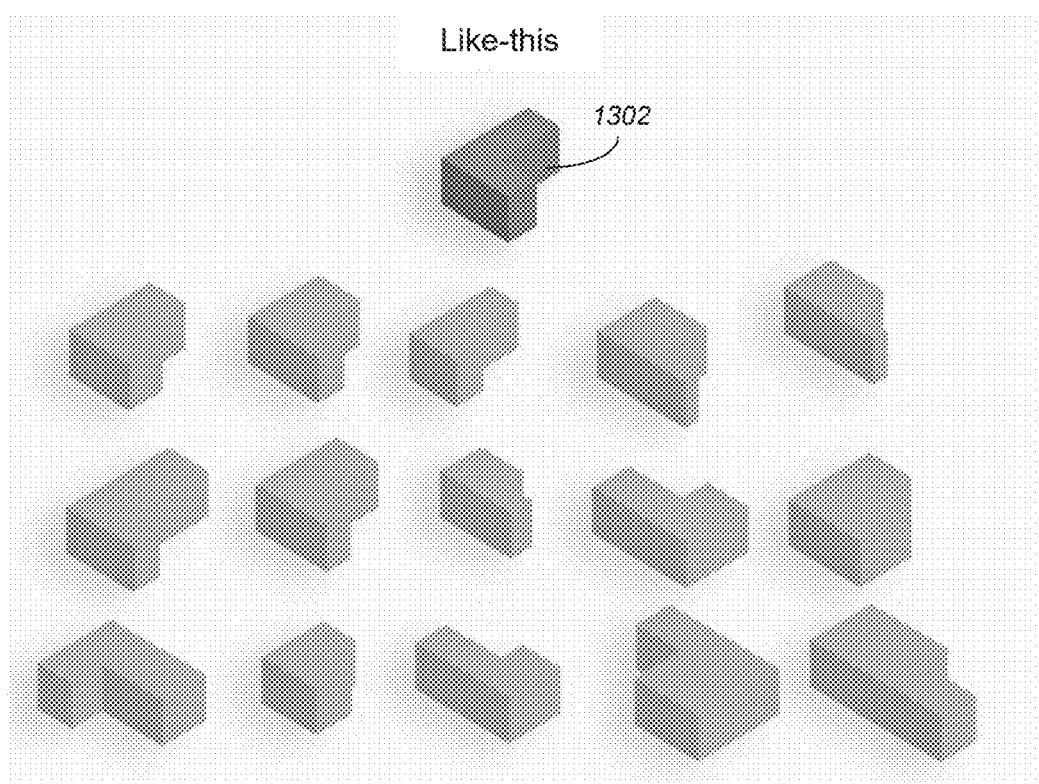
FIG. 13 illustrates exemplary form-finding/sensitivity analysis dataset geometries created using the like-this function in accordance with one or more embodiments of the invention.

FIG. 11 illustrates exemplary reusable synthetic dataset geometries created using the randomize function in accordance with one or more embodiments of the invention. FIG. 12 illustrates exemplary combinatorial analysis/feature search dataset geometries created using the randomize cross product function in accordance with one or more embodiments of the invention. FIG. 13 illustrates exemplary form-finding/sensitivity analysis dataset geometries created using the like-this function in accordance with one or more embodiments of the invention (i.e., geometries similar to the selected geometry 1302 are found/located).

Analytical Model Generation

Figure 14:
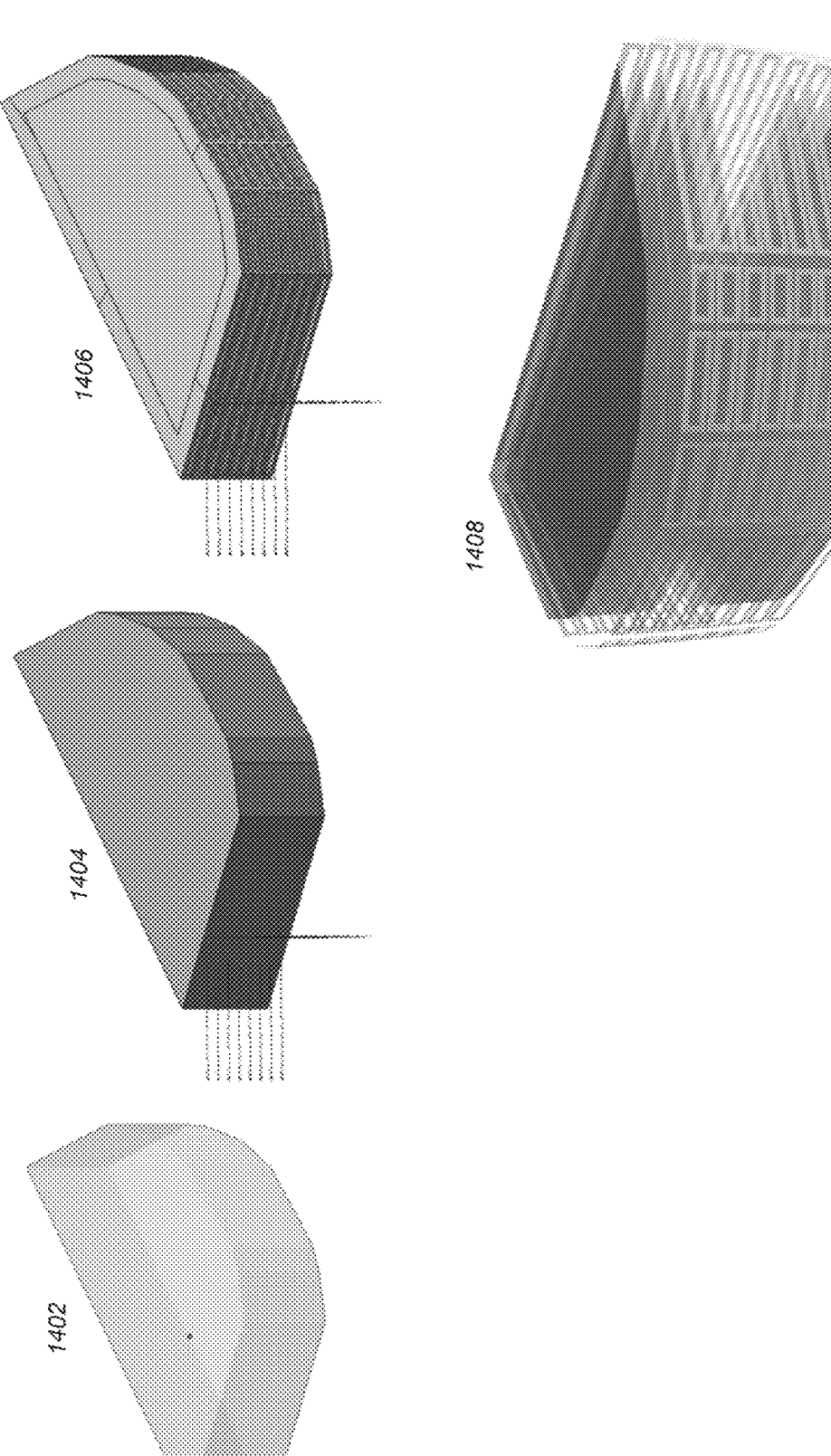
FIG. 14 illustrates exemplary views of geometries during the overall process for one conversion of mass to analytical model in accordance with one or more embodiments of the invention.
Figure 15:
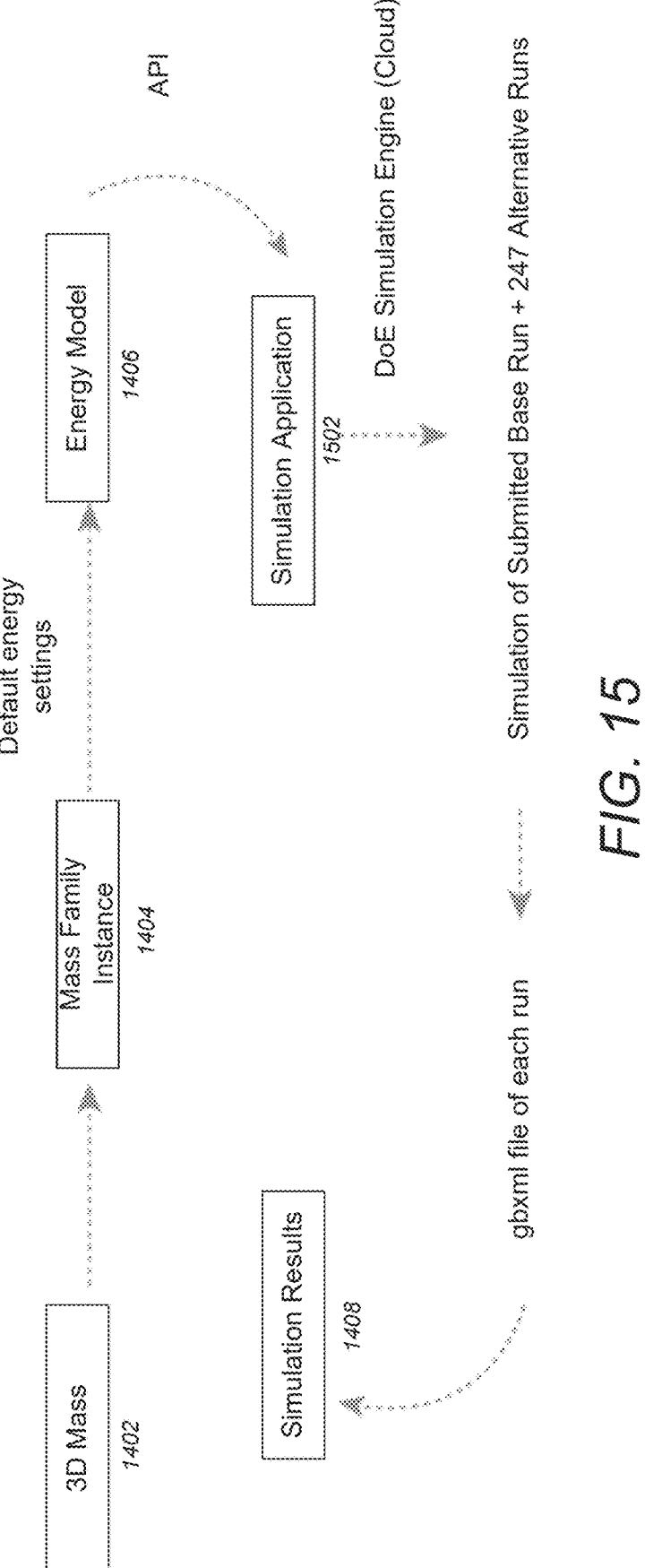
FIG. 15 illustrates the logical flow for the overall process for conversion of mass to analytical model in accordance with one or more embodiments of the invention.

With a goal to automate the analytical model generation workflow, it was essential to understand the general process of conceptual energy analysis using energy analysis applications (e.g., the REVIT application and GREEN BUILDING STUDIO application). This process can then be magnified and automated (e.g., using the DYNAMO visual programming application). FIG. 14 illustrates exemplary views of geometries during the overall process for one conversion of mass to analytical model in accordance with one or more embodiments of the invention. FIG. 15 illustrates the logical flow for the overall process for conversion of mass to analytical model in accordance with one or more embodiments of the invention. Usually, any generated mass 1402 must be converted to a mass family instance 1404, and then to an analytical model 1406 (e.g., an energy model based on default energy settings) to run a simulation using a simulation application 1502 (e.g., the models are provided to a simulation application 1502 via an application API). The simulation application/engine may execute in the cloud numerous times (e.g., a base run+247 alternative runs). The output from the simulation application/engine provides simulation results 1408 (which may consist of a combination of gbxml files generated for each run).

While trying to create a modular workflow for automating this entire process, embodiments of the invention provide the ability to handle various issues including:

Dealing with a large quantity of data;

A need for an automated submission of analysis;

A need for the analytical model generation workflow to work modularly and in tandem with the mass generation workflow;

Difficulty in sending multiple analytical models to a simulation application for simulation natively from an API (e.g., an API of the REVIT application);

Deprecated APIs and documentation voiding the possibility of externalizing a submission;

Inability to allow parametric control for energy settings variables; and

Looking for a way to retrieve a huge amount of results from the simulation application.

To solve these issues, one or more of the following strategies may be utilized:

Instead of geometry by geometry modification, embodiments of the invention provide for dumping/exporting geometry/mass generator workflows from one process (e.g., locally dumped as 3D geometry files such as spatial ACIS model [*.sat] files) for later use, and modifying the geometry in another process (e.g., reading and converting to energy models [gbxml]). In other words, the 3D geometry files are exported for a training dataset and as an input for the analytical generation workflow. One reason for de-coupling the mass generation and analytical model generation workflow was the fact that a generative design application (e.g., the REFINERY application) may not support computer-aided design (CAD) application (e.g., the REVIT application) API macros in the background. Hence, the workflow should have a different driving mechanism. The current workflow reads the spatial ACIS files (*.sat) from the locally dumped directory and brings it in as a solid geometry. For creating an analytical mass model for simulation, embodiments may require that this solid is either an in-place mass, or a mass family instance 1404. Accordingly, embodiments of the invention create a mass family instance 1404 from the solid geometry (i.e., 3D mass 1402).

In view of the above, embodiments of the invention may utilize two user inputs: (1) Floors Above Ground; and (2) Floor height, which together drive the overall height of the mass geometry (e.g., the mass family instance 1404). The workflow may also create a level sequence (of elevation values) with these inputs and create levels through these sequence of elevation values. With the combination of the mass and the levels, an analytical model 1406 can be made with various energy settings. The workflow is built to then export the gbxml file of the current generated analytical model locally (e.g., to a simulation application 1502). Stream gates may also be provided to allow/restrict export of gbxml, so that the workflow can be tested without dumping data.

A simple console app sends a batch of these gbxml files to a simulator 1502 for simulation, where the run IDs of each of these sent gbxml files are noted. This console app may emulate the simulator submission process using a simple HTTP Post Protocol without using specific APIs (Application Programming Interfaces). This directly externalizes the submission process and also allows parametric control of the energy setting variables. The results are retrieved directly from the server bucket by cross-referencing the saved runIDs.

Further to the above, embodiments of the invention may be executed/viewed as a framework of nodes where each sub-workflow flows from a node and can be used modularly as a combination of several other nodes. In other words, generative design may be used to generate a synthetic data set that is similar to real data in an efficient and effective manner. In particular, the desired representative diverse geometry may be categorized (into several categories) with individual algorithms (for each category) utilized to actual generate the geometric data (within each category).

Low Variability in EUIs (Driven by Low Variability in Geometries)

Using the above methodology, the variation in simulated EUIs for Phase 1 synthetic geometries may be extremely small (standard deviation 42 with mean 455). Using just the mean EUI of the training set as the predicted EUI in the test (without any predictors) resulted in only 4% prediction error (MAPE—mean absolute percentage error). An artificial neural network and random forest models almost perfectly explain this small variability in EUI—their prediction errors in terms of MAPE on the test set were only 0.32% and 0.28% respectively. Even a linear regression resulted only in about 1% MAPE (MAPE). While the error rates were calculated on the test set (which contained only geometries that were not used in training), a review of geometries (form, size, height and other geometric features range and variability) suggested the used synthetic geometries don't represent a realist range of office buildings. So, while the trained surrogate model resulted in very small prediction errors on the test, it very likely wouldn't perform at the same level on clients' building models which could have substantially different geometric attributes. In other words, the low prediction errors were mostly due to the low variability in simulated EUIs (resulted from the low variability of geometries).

To overcome the low variability in simulated EUIs, office building typologies in the US (primarily in the San Francisco Bay Area) were reviewed, the form and size ranges were documented, and those documented form and size ranges were used that as guidance for generating new solids. Based on this review, embodiments of the invention made sure that the new data set included buildings with setback/cantilever and varying elongations. The new geometries resulted in higher variation in simulated EUIs (standard deviation 231 with mean 673). Using just the mean EUI of the training set as the predicted EUI in the test set resulted in much larger MAPE (13.7%). But after including the predictors into the model the prediction errors dropped substantially. Although the prediction error (in terms of MAPE) was larger than the model that was built on Phase 1 data (4.1% vs 0.3%), the difference with base model (only mean) and the full model (model with all predictors) increased significantly.

Using Only Manhattanized Geometries

In generating the new synthetic set of geometries, embodiments of the invention focus mostly on increasing the variability of buildings in elongation, size, height and on including setbacks and cantilevers, and unlike other embodiments, convex non-Manhattanized geometry was not initially created. However, later about 100 convex non-Manhattanized geometry were created (about 15% of the total number of initial geometries) and simulated EUIs for them in a simulator (base run and 247 alternative runs). A series of tests were run to examine whether it was necessary to include non-Manhattanized geometries to the training set. In addition, models were trained using only Manhattanized geometries and tested against Manhattanized, non-Manhattanized and combined test sets. The model performed almost equally on the three different sets, suggesting that training models only on Manhattanized geometries would be sufficient (such model is expected to predict EUIs of non-Manhattanized geometries at the same level of accuracy as the it does for Manhattanized geometries.

High Multicollinearity and Feature Selection

In embodiments of the invention, no explicit feature selection process may be adopted in Phase 1, and in fact all initial features may be included in surrogate models). However, examining pair-wise correlations and variation inflation factors (VIFs) showed a high multicollinearity among predictors. More specifically, a pair-wise correlation between geometric features shows that some of the features were 100% correlated. While multicollinearity doesn't impact model performance (prediction accuracy) in neural networks, it can substantially slow down the training process by (1) making the neural network graph larger (increasing the number of input nodes and consequently connecting edges); and (2) requiring larger number iteration (epoch) needed to minimize MAPE on the validation set.

To improve upon such problems, embodiments of the invention provide for dropping one feature from each highly correlated pair (above 80%). Features with high VIF values were removed one at a time (step by step), and VIFs were recomputed until all VIF values reached below 5 (5 and 10 are commonly used rules of thumb for VIF as the indicator of multicollinearity, where 5 is a more conservative choice). A linear regression may then be fit to test the statistical significance of all remaining features. Results demonstrated that all remaining features turned out to be statistically significant (thus expected to contribute to model prediction accuracy). Consequently, instead of basing the feature selection on p-values of the coefficient estimates from a linear regression, embodiments of the invention may utilize a permutation approach; that is, to randomly shuffle values in features (one feature at a time), train and test the model, and compare the prediction in accuracy (on the test set, or on cross-validation test sets) against the full model as a measure of feature importance: the drop in prediction accuracy due to shuffling values of a feature shows the feature's magnitude of contribution to the model's accuracy. However, since for this approach the model should be trained and tested for each feature and considering the computation time for each of the models and the large number of features, some embodiments may not utilize such an approach.

Orientation Features

In one or more embodiments, during Phase 1, orientation was captured by wall areas facing eight (8) directions (North, East, South, West and 45-degree directions between these main directions). Such directions were arbitrary and the values were automatically generated by a simulator. These features, however, are limiting in the case of more complex forms, and even in simple geometries that are not aligned to these main directions. They also tend to be highly correlated to each other (e.g. in typical rectangular shapes, the area of North and South walls would be the same) and to the total façade area (the area of South walls will be greater for larger buildings with larger total faced area). In a way, expressing orientation as the area of walls facing certain direction doesn't give much addition information to the model.

To provide additional information for the model and improve accuracy, embodiments of the invention provide the ability to express orientation as a projected area to two main directions (South and East) and as a ratio to the total area. Using ratio to the total removes the correlation with the total area, and purely expresses orientation independent of the size of the building. As a result, even if a building is rotated, embodiments of the invention would still be able to capture relevant information (e.g., if a larger building has a larger South facing area, the projection provides the ability to capture how much South/North facing area exists for the building). In this regard, a ratio of a particular facing area to total area is used instead of merely using that particular facing area as the total area. With a ratio, the size of the building does not matter, and enables the decorrelation of features thereby improving model accuracy.

Figures 16, 17, 18:
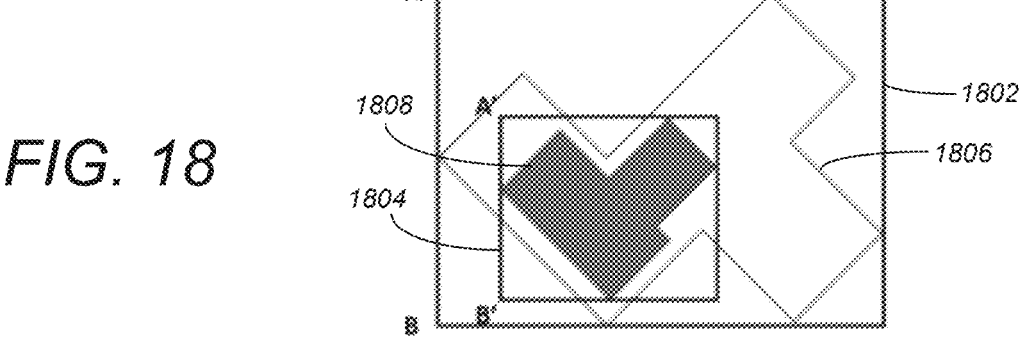
FIG. 16 illustrates the process for expressing the orientation as a projected aera and as a ratio in accordance with one or more embodiments of the invention.
FIG. 17 illustrates the bounding box that bounds a building to express the orientation in accordance with one or more embodiments of the invention.
FIG. 18 illustrates exemplary bounding boxes and for each of the two building levels and respectively in accordance with one or more embodiments of the invention.

FIG. 16 illustrates the process for expressing the orientation as a projected aera and as a ratio in accordance with one or more embodiments of the invention.

At step 1602, the minimum bounding box that is aligned with South-North and East-West direction is created. FIG. 17 illustrates the bounding box 1702 that bounds the building 1704.

At step 1604, the area of South and East facing surfaces of this bounding box 1702 are calculated:

East-Facing projected area=$L_{AB}$×H
South-Facing projected area=$L_{BC}$×H

At step 1606, the East-facing index and South-facing index are calculated by dividing the above values by the total façade area of the building:

East-Facing index=$L_{AB}$×H/total façade area
South-Facing index=$L_{BC}$×H//total façade area This can be extended to the case of buildings with varying outlines in different levels, by repeating step 1604 for each floor separately (where H would be the height of individual floors) and divide the sum over the total façade area. FIG. 18 illustrates exemplary bounding boxes 1802 and 1804 for each of the two building levels 1806 and 1808 respectively in accordance with one or more embodiments of the invention. Step 1606 provides for computing the East-Facing index as follows:

East-Facing index=($L_{AB}$×$H_1$+$L_{A'B'}$×$H_2$)/total façade area

Estimated Eui V. Simulated Euis

For each base run, a simulator (e.g., the AUTODESK GREEN BUILDING STUDIO simulator) can generate 247 alternative runs, by changing one setting at a time (e.g. changing only the glazing property or window to wall ratio of the base run). Building performance analysis software (e.g., the AUTODESK INSIGHT application) can generate many random scenarios for each base run by combining multiple simulated alternative runs (i.e., scenarios in which multiple properties are different from the base run). The performance analysis software may then estimate EUIs for those random combinations based on simulated EUIs for a base and the 247 alternative runs. The estimation is simply based on how much energy is saved or lost in each alternative run and summing up energy losses and savings for each scenario (each scenario is a combination of multiple alternative runs, each either results in an energy saving or loss).

Ideally, the building performance software's estimated EUIs for a combination should be the same as simulated EUIs for that combination. Accordingly, if a model is trained only on estimated EUIs and tested with simulated data, one may expect the prediction accuracy to not deviate significantly from when training and testing are both performed on building performance analysis data. However, tests show significant difference between the prediction accuracy level in these two cases. Further, a reverse test where the model is trained simulated results and predicted on analysis software data, resulted in a significantly large prediction error.

To overcome such issues, embodiments of the invention generate random combinations of energy settings and only use actual simulated EUIs.

Data Processing Using Data Frames

Data processing may constitute a two-step process with each step potentially performed in separate code/functions (or via a single code).

The first step takes three inputs:

(1) a csv file with geometric features;

(2) a csv file of all runs from a simulator with simulated EUIs and rundIDs (corroding to buildings/geometries) and Titles of runs (e.g., name of alternative runs); and (3) a constant csv file that shows for each alternative run (represented by the title of the run) what features are changed and provides the new value of that feature for that run; this file is constant for all climate zones.

The process creates a dataframe with 248 rows for valid geometries (those with EUI for the base run and at least 238 successful runs), with energy settings and geometric features values for each case. The base run values are hard-coded (are constant) and alternative run values come from the constant csv file. This dataframe is used to create the three (3) main outputs of Step 1: (1) a csv file with all cases that have valid EUIs with all features that goes to the model. The name of the geometry and alternative runs are also kept in this output, as they will be used later during the training and testing phase. This data set will be used to train models that are only based on simulated EUIs; (2) two other csv files that will be used as inputs to the building analysis software; and (3) The final processed geometric features are another csv output, which is used in Step 2, and will be joined with building analysis software output (this is done to avoid repeating computing geometric properties in step 2.

The second step gets building analysis software outputs (randomized combination of energy settings with estimated EUIs), finds cases that are affected by failed alternative runs and removes them, and joins the final geometric features. The generated outcome will be used for training models that are only based on estimated EUIs.

Phase 2

Once the synthetic data has been generated in Phase 1 above, Phase 2 provides the ability to generate a surrogate model (based on the synthetic data) that replaces the prior art execution of simulations on proposed designs. The surrogate model can then be used to accelerate the process of obtaining designs for specific geometries. In one or more exemplary embodiments in an energy analysis, the surrogate model may be utilized to create a real-time energy prediction service, reducing the time and computation of prior art simulations, and facilitating the integration of energy evaluation in the geometric modeling environment.

Surrogate Model Creation

Described herein is an exemplary surrogate model for energy use intensity (EUI) analysis. However, embodiments of the invention are not limited to energy use intensity analysis and may be utilized in a variety of other use cases (see other applications/fields described below).

Figure 19:
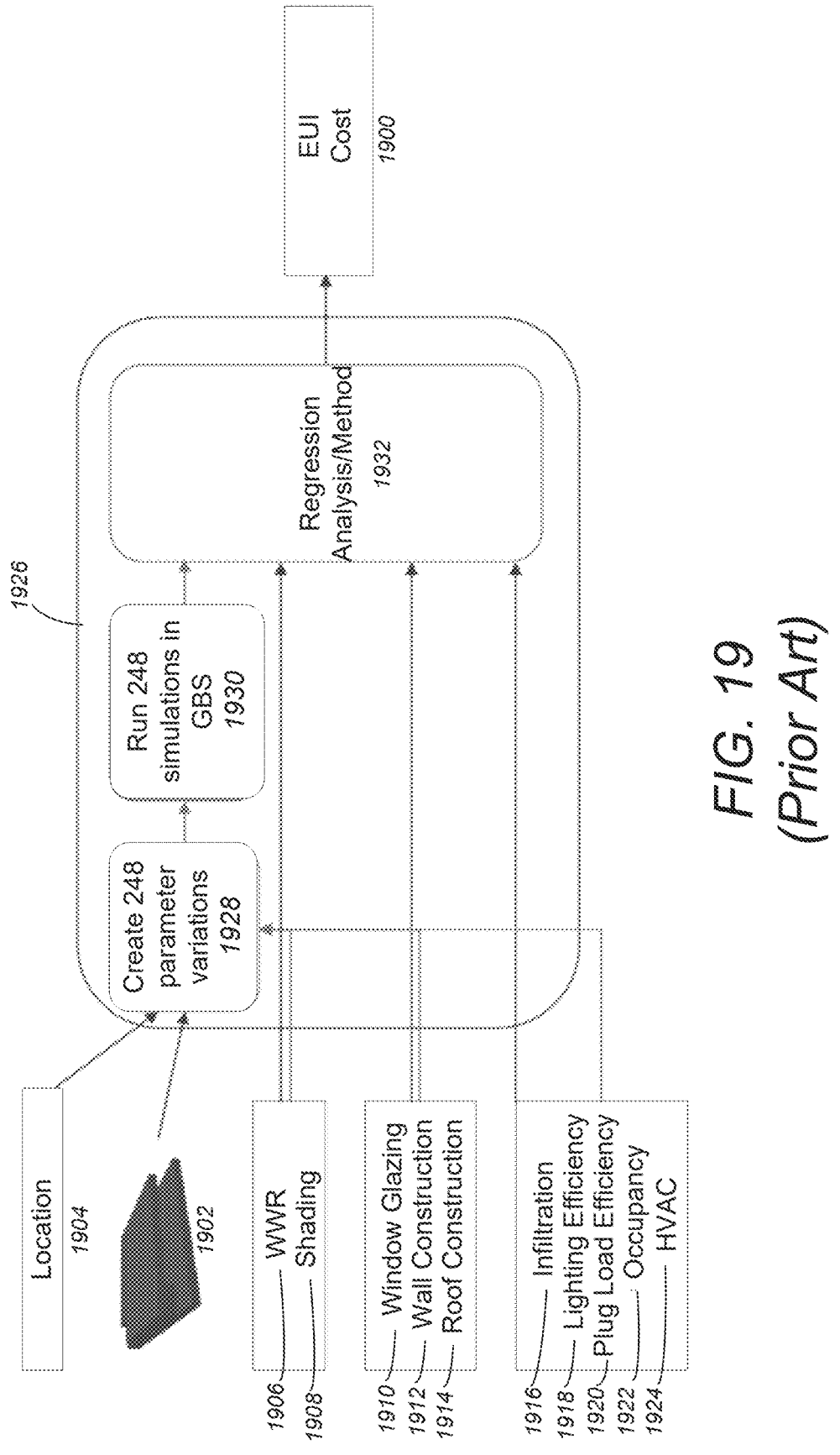
FIG. 19 illustrates the logical flow for an exemplary energy use intensity analysis in accordance with the prior art.

FIG. 19 illustrates the logical flow for an exemplary energy use intensity analysis in accordance with the prior art. To calculate the EUI cost 1900, inputs may include a building geometry 1902 in a specific location 1904, as well as values for the following parameters: Window to Wall Ratio (WWR) North-South-East-West 1906, Shading North-South-East-West 1908, Window Glazing North-South-East-West 1910, Wall Construction 1912, Roof Construction 1914, Infiltration 1916, Lighting Efficiency 1918, Plug Load Efficiency 1920, Occupancy 1922, and HVAC system 1924. The calculation 1926 then estimates the EUI 1900 based on those inputs 1902-1924. Once a geometry 1902 is submitted by the user, embodiments of the invention may use a simulator (e.g., AUTODESK GREEN BUILDING STUDIO (GBS)) to run 248 simulations 1930 with pre-determined parameter values 1928. Once the simulations are complete, a statistical regression method 1932 (e.g., using a regression model) may be used to predict the EUI 1900 for any parameter values the user may define.

The current bottleneck in this process is the set of 248 computationally intensive simulations 1930 that need to be run whenever a new geometry is submitted. This makes it impossible to use certain prior art applications for geometry exploration in the early design phase, although it can be easily used for optimal building parameters selection at a later design stage.

Figure 20:
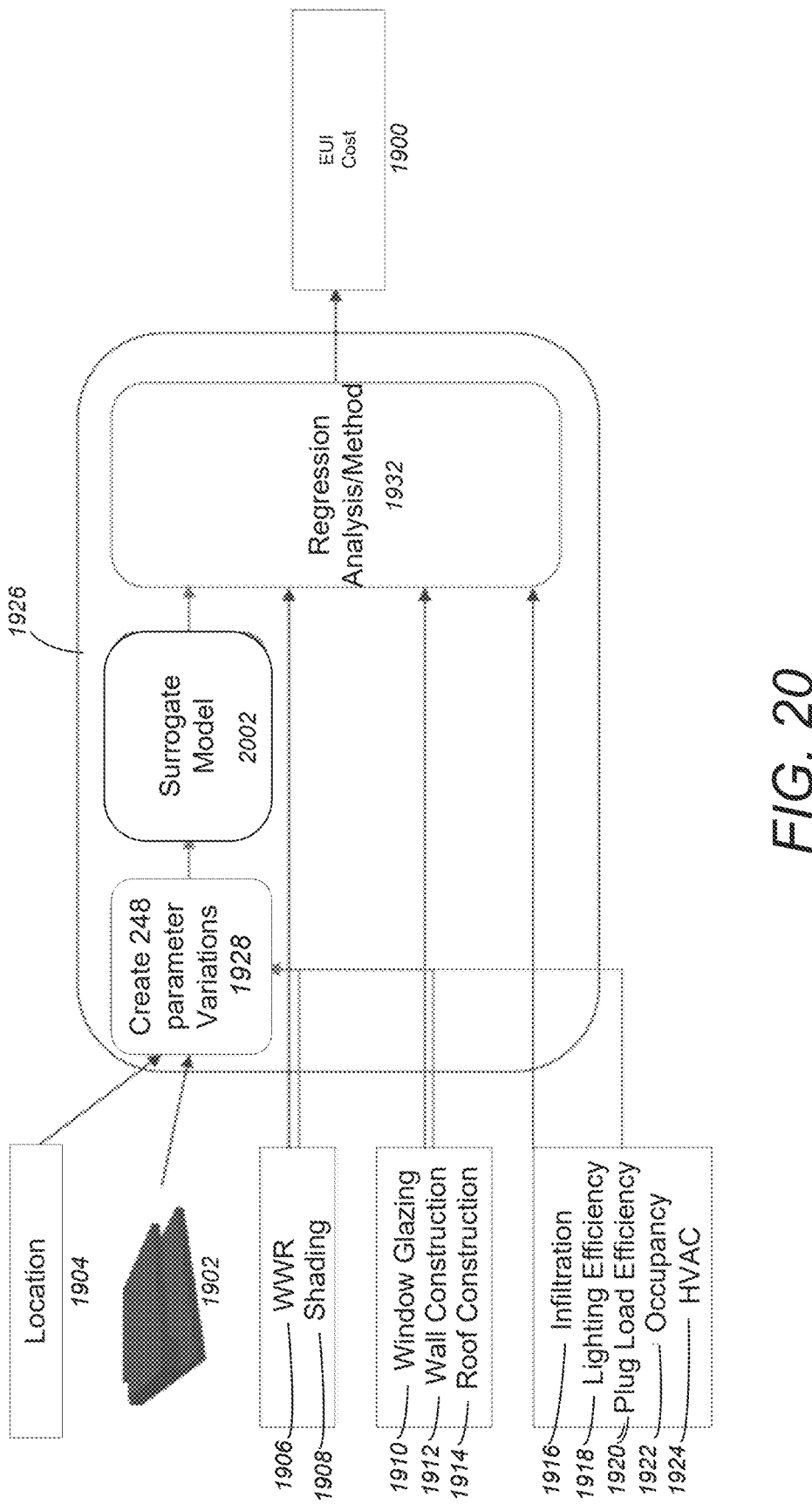
FIG. 20 illustrates the logical flow for an exemplary energy use intensity analysis based on a surrogate model in accordance with embodiments of the invention.
Figure 21:
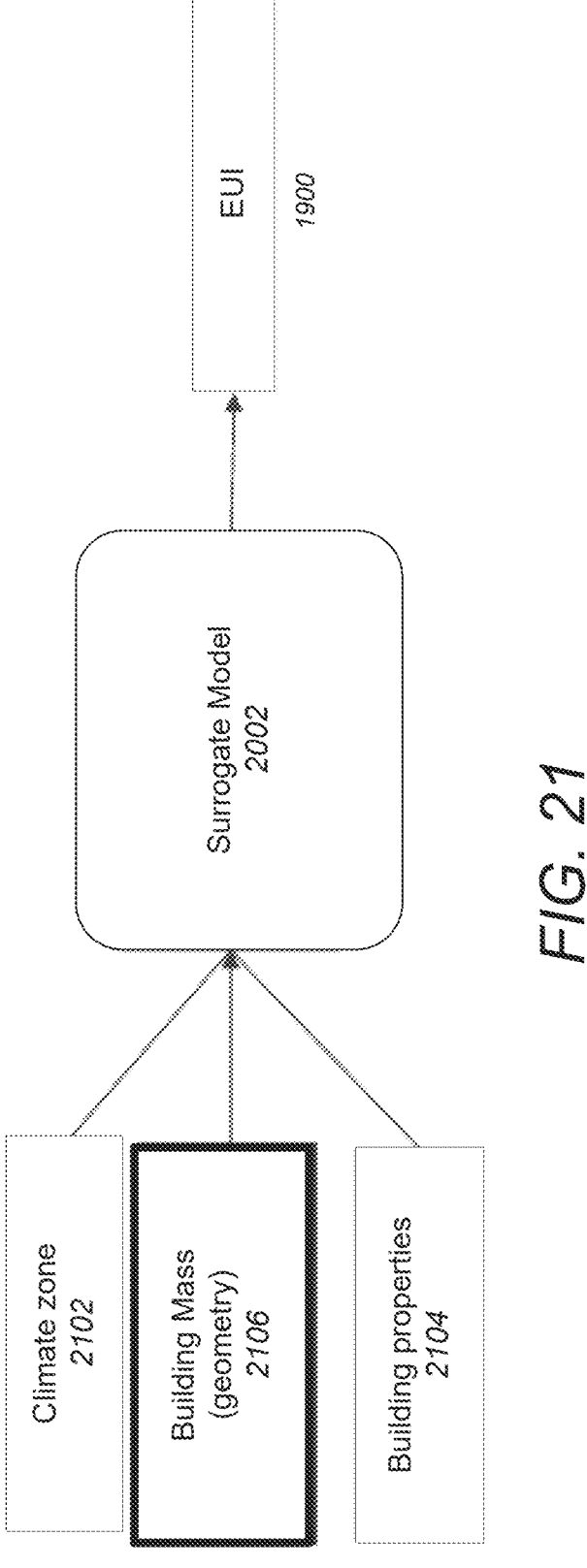
FIG. 21 illustrates another view of the logical flow for an exemplary energy use intensity analysis in accordance with one or more embodiments of the invention.

Accordingly, embodiments of the invention develop a surrogate model to replace the computationally expensive simulations 1930, with a focus on accounting for geometric variability. FIG. 20 illustrates the logical flow for an exemplary energy use intensity analysis based on a surrogate model 1702 in accordance with embodiments of the invention. FIG. 21 illustrates another view of the logical flow for an exemplary energy use intensity analysis in accordance with one or more embodiments of the invention. As illustrated, the different climate zones 2102 and building properties 2104 (e.g., that may include the properties described with respect to FIG. 19) are combined with the building mass geometries 2106 for evaluation by the surrogate model 2002.

Data

The dataset used to test embodiments of the invention consists of 862 building geometries. In a singlezone subset of the dataset, all buildings are assigned to the same location (i.e. Boston, climate zone 5A). In a multizone subset of the dataset, each building is assigned one out of five possible locations (climate zones 1A, 3B, 4B, 5A, 8).

Figure 22:
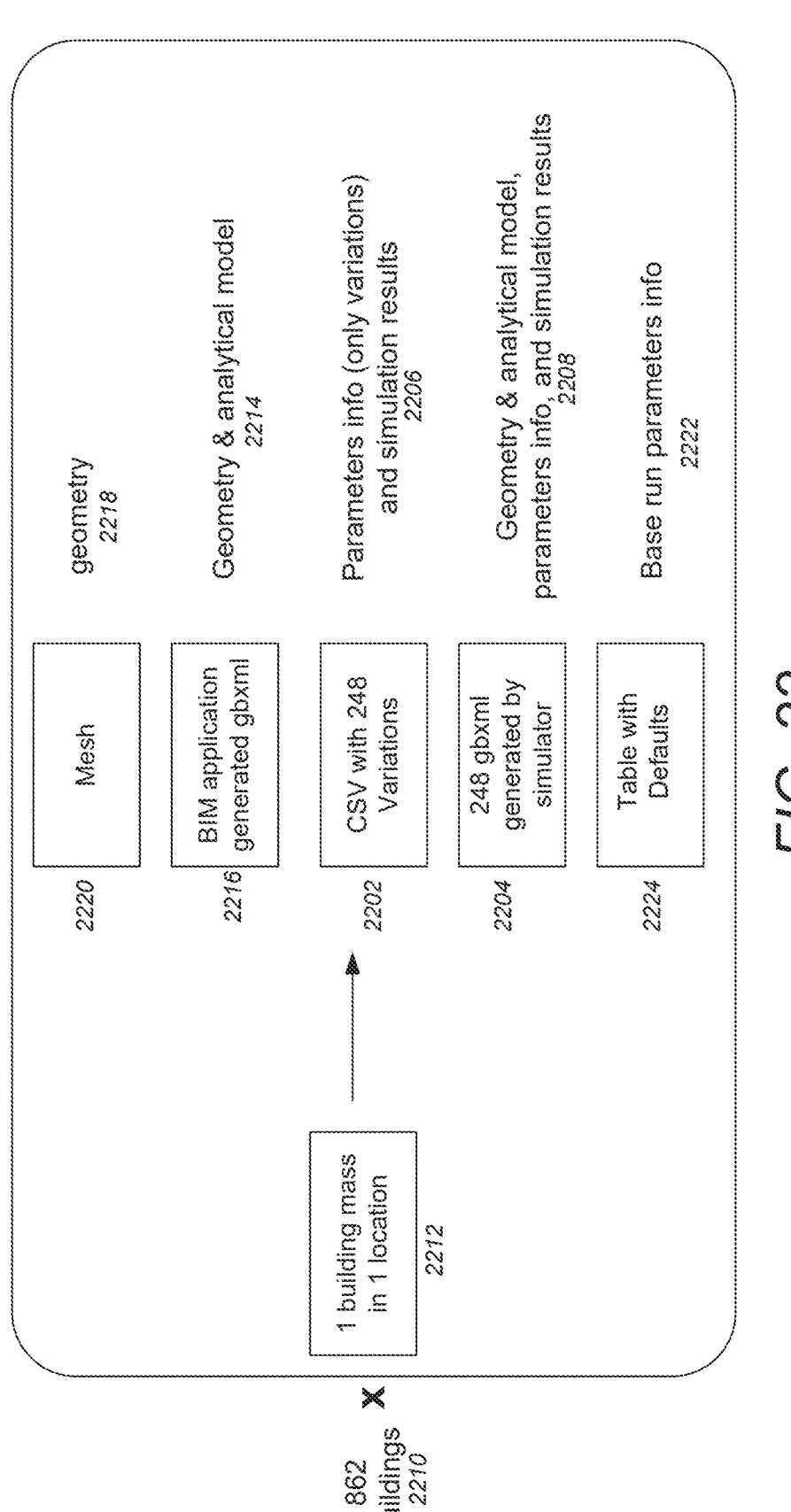
FIG. 22 illustrates an exemplary process for compiling a dataset in accordance with one or more embodiments of the invention.

FIG. 22 illustrates an exemplary process for compiling a dataset in accordance with one or more embodiments of the invention. A list of 248 variations are generated for each building 2202 and 2204, and the results (EUI) are retrieved (e.g., from a simulation application). For a detailed description of this process, see Phase 1 above. The simulation results come in two formats: (i) a single .csv file 2202 containing all buildings and all variations (862 buildings*248 simulation runs) (i.e., the parameters information (with variations) and simulation results 2206). A column named "Title" indicates what building parameter values were used for each simulation run; and (ii) one .gbxml file 2204 for each of the 248 runs (i.e., with the geometry & analytical model information, parameter information, and simulation results 2208).

As illustrated, the dataset of 862 base runs 2210 (singlezone buildings 2212 [i.e., 1 building mass in 1 location) was used with a set of gbxml-extracted geometry-defining features (i.e., the geometry and analytical model 2214 from the BIM application generated gbxml 2216) to represent the geometry 2218 (i.e., via a mesh 2220).

The first out of the 248 simulation runs is the base run. If the building parameters are not explicitly defined before a geometry 2218 is submitted to the simulator (e.g., which may occur during a data generation process), then the simulator determines the values of these (base run) parameters 2222 based on default settings (i.e., the table with defaults 2224). Therefore, in order to determine the values of all of the building parameters of a base run, access to two sources may be required: (1) a building geometry 2218 to identify WWR 1906 and shading 1908, and (2) the simulator defaults 2224 to identify all the rest of the parameters. The default values 2224 may depend on climate zone, building area, and number of floors, and may be encoded in individual tables.

In order to generate the correct set of parameters of each of the remaining 247 runs, a dictionary and parsing method matching the title of the simulation run to the corresponding parameter value may be generated.

After trial-error experimentation, embodiments of the invention utilize/select fifteen (15) features:

Number Of Floors (an integer value of the total number of floors)

Envelope Area To Volume (ratio of the envelope area to the overall volume of the mass)

Total Floor Area To Volume (constant unless floor to ceiling height varies)

Envelope Area To Floor Area

Total Roof Area

Total Interior Floor Area (sum total of all floor plate areas)

Total Slab On Grade Area

Wall Area North (projected area to the North)

Wall Area South (projected area to the South)

Wall Area East (projected area to the East)

Wall Area West (projected area to the West);

Wall Area North East (projected area to the North East)

Wall Area North West (projected area to the North West)

Wall Area South East (projected area to the South East)

Wall Area South West (projected area to the South West)

Additional features may include:

Roof Max height (the highest Z value of the horizontal surfaces, e.g., floors*floor height)

Total Envelope Area (the total area of all exposed surfaces in the envelope)

Envelope Area to Volume (ratio of the envelope area to the overall volume of the mass)

Total Exterior Wall Area (windows not included)

Wall Area WO Windows (total vertical surface area (windows area+opaque wall areas)

Total Exposed Roof Area (total area of exposed horizontal surfaces)

Footprint Area (area at the bottom most footprint—not the projected footprint).

Footprint Perimeter (area of the bottom most footprint—note the projected footprint).

Total Volume (total volume of the solid mass)

Total Window Area (WWR*the wall area (total surface area of all window surfaces)).

A python gbxml parsing module was used to extract these features from the generated gbxml files 2204.

Next, two alternatives for the integration of a surrogate model in an energy prediction system are compared. The comparison was made for a single climate zone (5A).

Referring again to FIG. 20, in the first option the surrogate model 2002 directly replaces a simulator. This means that for every geometry change, the system will get 248 predictions from the surrogate model and use them with a statistical analysis/method 1932 (e.g., the INSIGHT STATISTICAL REGRESSION MODEL) to calculate the EUI 1900 with the specified building parameters.

In a second exemplary embodiment, a surrogate model 2002 that can directly predict EUI 1900 for any combination of parameters is used. In order to better train that model, an Interpolation Model (also referred to as an INSIGHT Interpolation and/or an INSIGHT Statistical Regression Model) can be used that can create an augmented version of the dataset. The augmented dataset does not contain 248 predetermined parameter variations for each building as before. In contrast, a desired number of random parameter combinations for each building can be sampled with the help of this Interpolation Model.

An augmented dataset with 1000 samples per geometry was used to train a neural net that achieved 1.4% error in the EUI prediction. In order to compare the performance of the two alternative workflows, the final error of the first workflow was calculated by comparing the Interpolation model results on random parameter combinations using the 248 EUI ground truth values on hand, and using the 248 predicted EUI values on the other. The final error of the first workflow was calculated at 1.33%. In the end, the second workflow was selected mainly with the argument of reducing computation and complexity of the inference process, while adding it during the data preparation and model training. Finally, the data-862-multizone was augmented with 2000 random parameter combinations and a single neural net achieved an error of 1.91% for 5 climate zones.

Prototype

A prototype for embodiments of the invention were implemented in the DYNAMO visual programming application and demonstrates real-time EUI prediction. An HTTP client communicates with a (PYTHON) server, where the actual prediction is happening. Alternatively, embodiments also replace the serve with an AWS lambda function. Feature extraction is provided by first converting geometries to a gbxml format. Alternatively, feature extraction may be performed with another parser that extracts the features (wall areas, floor areas, volume, etc.) directly from geometries.

Logical Flow

Figure 23:
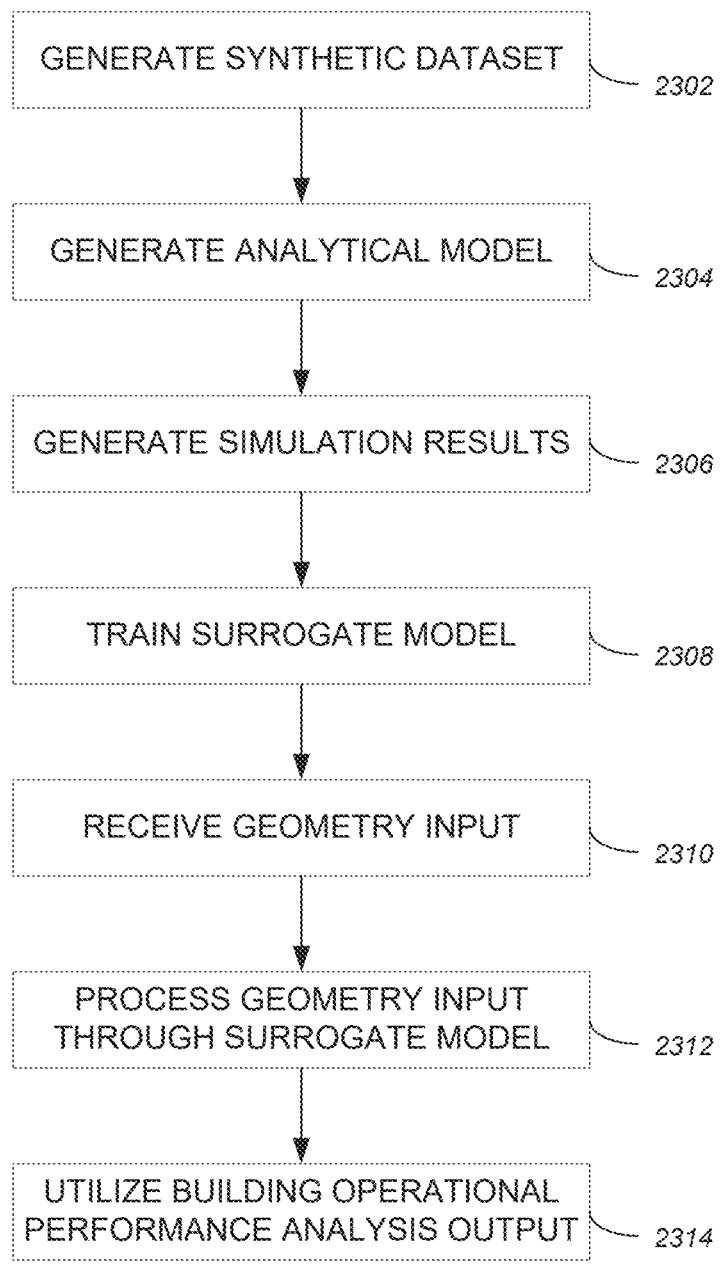
FIG. 23 illustrates the logical flow for generation and using a building operational performance analysis output in accordance with one or more embodiments of the invention.

In view of the above, FIG. 23 illustrates the logical flow for generation and using a building operational performance analysis output in accordance with one or more embodiments of the invention.

At step 2302, a synthetic data set is generated. The synthetic data set includes a set of three-dimensional (3D) building conceptual mass geometries. The generation of the synthetic dataset includes identifying two or more geometry types, dividing the two more geometry types into categories at a footprint level and a massing level, and algorithmically generating the 3D building conceptual mass geometries using a separate workflow for each category (wherein the algorithmically generating utilizes generative design). The identification of the geometry types may include conducting a correlational study. Such a correlational study may include utilizing a set of features consisting essentially of: a number of floors, (a roof max height—optional), an envelope area to volume, a total floor area to volume, an envelope area to floor area, (a total exterior wall area—optional), a total roof area, a total interior floor area, a total slab on grade area, a wall area North, a wall area South, a wall area East, a wall area West, a wall area North East, a wall area North West, a wall area South East, and a wall area South West.

Alternatively, or in addition to the above, the correlational study may include utilizing the set of features, where the set of features express orientation as a projected area to two directions and as a ratio to a total area.

As described above, the division of the two or more geometry types at the footprint level may include dividing the two or more geometry types into convex geometry and concave geometry, dividing the convex geometry into cyclic-polygons and non-cyclic polygons, and dividing the concave geometry into orthogonal polygons and non-orthogonal polygons.

The workflow for the convex geometry cyclic-polygons may include generating a footprint guiding circle (that determines a position and a scale of a convex geometry cyclic polygon), dividing the footprint guiding circle into dividers, (wherein the dividers determine a number of vertices of the convex geometry cyclic polygon), determining a vertex density that defines a percentage of the dividers to utilize as vertices, and generating (based on the dividers and vertex density) a convex hull that represents a footprint for the convex geometry cyclic polygon.

The workflow for the convex geometry noncyclic-polygons may include generating a point-grid (that has a defined number of grid points on an X direction and a Y direction) where the point-grid determines a scale and aspect ratio of a convex geometry noncyclic polygon. Thereafter, a vertex density that defines a percentage of the grid points to utilize as vertices is determined. Based on the point-grid and vertex density, a convex hull is generated that represents a footprint for the convex geometry noncyclic polygon.

The workflow for the concave geometry orthogonal polygons may include generating a point-grid (that has a defined number of grid points on an X direction and a Y direction) where the point-grid determines a scale and aspect ratio of a concave geometry orthogonal polygon. A vertex density is determined that defines a percentage of the grid points to utilize as vertices. Thereafter, based on the point-grid and vertex density, a convex hull that represents a base footprint for the concave geometry orthogonal polygon is generated. The base footprint is Manhattanized to generate the concave geometry orthogonal polygon. Manhatantization includes an iterator beginning at a first vertex of the vertices in the base footprint, and traversing through the vertices. The iterator checks if a next immediate vertex of the vertices is linearly displaced or obliquely displaced. If linearly displaced, the iterator proceeds to a next vertex. If obliquely displaced, the iterator adds an additional Manhattan Point that is an intersection of linear extensions of a current vertex and a next vertex. Once all the Manhattan Points are added, all points are joined together with a closed polycurve that is output as a final footprint of the concave geometry orthogonal polygon.

The workflow for the concave geometry non-orthogonal polygons may include generating a footprint guiding circle (that determines a position and a scale of a concave geometry non-orthogonal polygon). The footprint guiding circle is divided into dividers that determine a number of vertices of the concave geometry non-orthogonal polygon. A vertex density is determined that defines a percentage of the dividers to utilize as vertices. Thereafter, a child point density is determined that identifies/determines a percentage of the vertices to serve as parent points that are extrapolated to sub-points as child points. The child points include extensions of parent points to an interior of the footprint guiding circle. A child point parameter is determined that identifies/determines how much each child point is extended from the parent vertex points. Lastly, a polycurve may be generated by joining together the parent vertex points and the child vertex points. Such a polycurve serves as a final footprint of the concave geometry non-orthogonal polygon.

The division of the two or more geometry types at the massing level may include dividing the two more geometry types into convex geometry and concave geometry, dividing the convex geometry into convex simple extrusion and convex variable extrusion, dividing the convex variable tower extrusion into aligned and non-aligned, dividing the non-aligned into convex uniform and convex non-uniform, dividing the concave geometry into concave simple extrusion and concave variable extrusion, and dividing the concave variable extrusion into concave uniform and concave non-uniform.

The separate workflows for each category are based may be based on one or more modifier variables that change a nature and shape of the 3D building conceptual mass geometry and define a base case, and one or more generator variables that vary the base case into different samples and generate a new geometry in a same category. Further, the generative design may create the synthetic dataset that is reusable using a randomize function, create the synthetic dataset based on a feature search using a cross product function, create the synthetic dataset based on a sensitivity analysis using a like-this function, and generate design alternatives for the synthetic dataset based on input design goals and parameters.

At step 2304, an analytical model that is associated with each of the 3D building conceptual mass geometries is generated. The analytical model generation may include exporting the 3D building conceptual mass geometries as 3D geometry files, creating a level sequence based on inputs (wherein the inputs comprise a number of floors above ground and a floor height), and generating the analytical model based on the 3D conceptual mass geometries and the inputs. In addition, the analytical model may be trained using only Manhattanized geometries.

At step 2306, simulation results for each of the analytical models are generated by conducting a simulation based on each of the analytical models.

At step 2308, a surrogate model is trained based on a set of features extracted from the simulation results using machine learning (ML). The ML iteratively determines the set of features based on a measured accuracy of the surrogate model.

At step 2310, geometry input is received.

At step 2312, the geometry input is processed through the surrogate model to generate the building operational performance analysis output.

At step 2314, the building operational performance analysis output is utilized to inform the designer about the approximate Energy Use Intesity of their current design. Designers can make model geometry and parameter changes, re-submit for analysis, and rapidly see if their changes improve or deteriorate their design performance.

Hardware Environment

Figure 24:
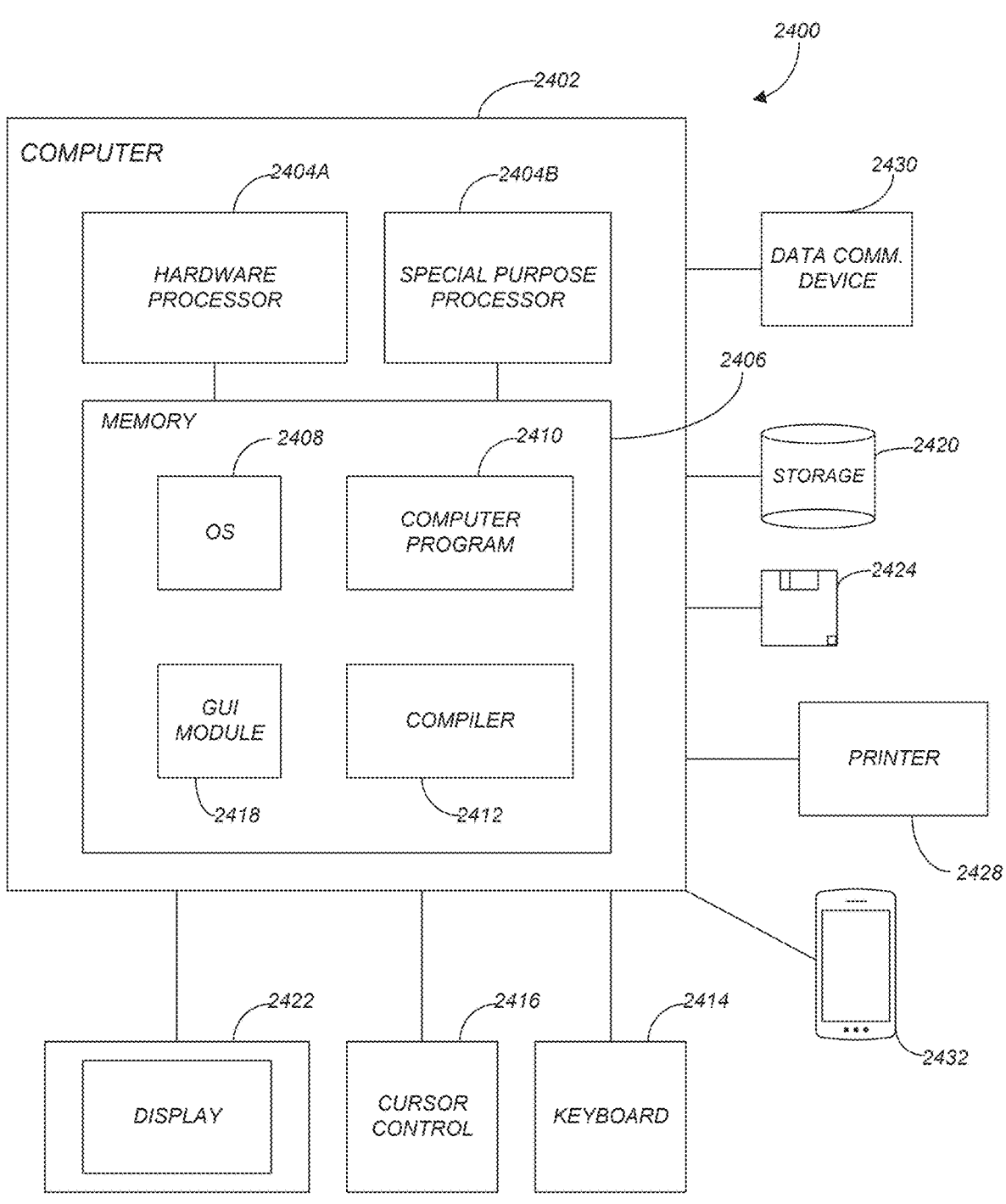
FIG. 24 is an exemplary hardware and software environment used to implement one or more embodiments of the invention.

FIG. 24 is an exemplary hardware and software environment 2400 (referred to as a computer-implemented system and/or computer-implemented method) used to implement one or more embodiments of the invention. The hardware and software environment includes a computer 2402 and may include peripherals. Computer 2402 may be a user/client computer, server computer, or may be a database computer. The computer 2402 comprises a hardware processor 2404A and/or a special purpose hardware processor 2404B (hereinafter alternatively collectively referred to as processor 2404) and a memory 2406, such as random access memory (RAM). The computer 2402 may be coupled to, and/or integrated with, other devices, including input/output (I/O) devices such as a keyboard 2414, a cursor control device 2416 (e.g., a mouse, a pointing device, pen and tablet, touch screen, multi-touch device, etc.) and a printer 2428. In one or more embodiments, computer 2402 may be coupled to, or may comprise, a portable or media viewing/listening device 2432 (e.g., an MP3 player, IPOD, NOOK, portable digital video player, cellular device, personal digital assistant, etc.). In yet another embodiment, the computer 2402 may comprise a multi-touch device, mobile phone, gaming system, internet enabled television, television set top box, or other internet enabled device executing on various platforms and operating systems.

In one embodiment, the computer 2402 operates by the hardware processor 2404A performing instructions defined by the computer program 2410 (e.g., a computer-aided design [CAD] application) under control of an operating system 2408. The computer program 2410 and/or the operating system 2408 may be stored in the memory 2406 and may interface with the user and/or other devices to accept input and commands and, based on such input and commands and the instructions defined by the computer program 2410 and operating system 2408, to provide output and results.

Output/results may be presented on the display 2422 or provided to another device for presentation or further processing or action. In one embodiment, the display 2422 comprises a liquid crystal display (LCD) having a plurality of separately addressable liquid crystals. Alternatively, the display 2422 may comprise a light emitting diode (LED) display having clusters of red, green and blue diodes driven together to form full-color pixels. Each liquid crystal or pixel of the display 2422 changes to an opaque or translucent state to form a part of the image on the display in response to the data or information generated by the processor 2404 from the application of the instructions of the computer program 2410 and/or operating system 2408 to the input and commands. The image may be provided through a graphical user interface (GUI) module 2418. Although the GUI module 2418 is depicted as a separate module, the instructions performing the GUI functions can be resident or distributed in the operating system 2408, the computer program 2410, or implemented with special purpose memory and processors.

In one or more embodiments, the display 2422 is integrated with/into the computer 2402 and comprises a multi-touch device having a touch sensing surface (e.g., track pod or touch screen) with the ability to recognize the presence of two or more points of contact with the surface. Examples of multi-touch devices include mobile devices (e.g., IPHONE, NEXUS S, DROID devices, etc.), tablet computers (e.g., IPAD, HP TOUCHPAD, SURFACE Devices, etc.), portable/handheld game/music/video player/console devices (e.g., IPOD TOUCH, MP3 players, NINTENDO SWITCH, PLAYSTATION PORTABLE, etc.), touch tables, and walls (e.g., where an image is projected through acrylic and/or glass, and the image is then backlit with LEDs).

Some or all of the operations performed by the computer 2402 according to the computer program 2410 instructions may be implemented in a special purpose processor 2404B. In this embodiment, some or all of the computer program 2410 instructions may be implemented via firmware instructions stored in a read only memory (ROM), a programmable read only memory (PROM) or flash memory within the special purpose processor 2404B or in memory 2406. The special purpose processor 2404B may also be hardwired through circuit design to perform some or all of the operations to implement the present invention. Further, the special purpose processor 2404B may be a hybrid processor, which includes dedicated circuitry for performing a subset of functions, and other circuits for performing more general functions such as responding to computer program 2410 instructions. In one embodiment, the special purpose processor 2404B is an application specific integrated circuit (ASIC).

The computer 2402 may also implement a compiler 2412 that allows an application or computer program 2410 written in a programming language such as C, C++, Assembly, SQL, PYTHON, PROLOG, MATLAB, RUBY, RAILS, HASKELL, or other language to be translated into processor 2404 readable code. Alternatively, the compiler 2412 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 2410 accesses and manipulates data accepted from I/O devices and stored in the memory 2406 of the computer 2402 using the relationships and logic that were generated using the compiler 2412.

The computer 2402 also optionally comprises an external communication device such as a modem, satellite link, Ethernet card, or other device for accepting input from, and providing output to, other computers 2402.

In one embodiment, instructions implementing the operating system 2408, the computer program 2410, and the compiler 2412 are tangibly embodied in a non-transitory computer-readable medium, e.g., data storage device 2420, which could include one or more fixed or removable data storage devices, such as a zip drive, floppy disc drive 2424, hard drive, CD-ROM drive, tape drive, etc. Further, the operating system 2408 and the computer program 2410 are comprised of computer program 2410 instructions which, when accessed, read and executed by the computer 2402, cause the computer 2402 to perform the steps necessary to implement and/or use the present invention or to load the program of instructions into a memory 2406, thus creating a special purpose data structure causing the computer 2402 to operate as a specially programmed computer executing the method steps described herein. Computer program 2410 and/or operating instructions may also be tangibly embodied in memory 2406 and/or data communications devices 2430, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 2402.

Figure 25:
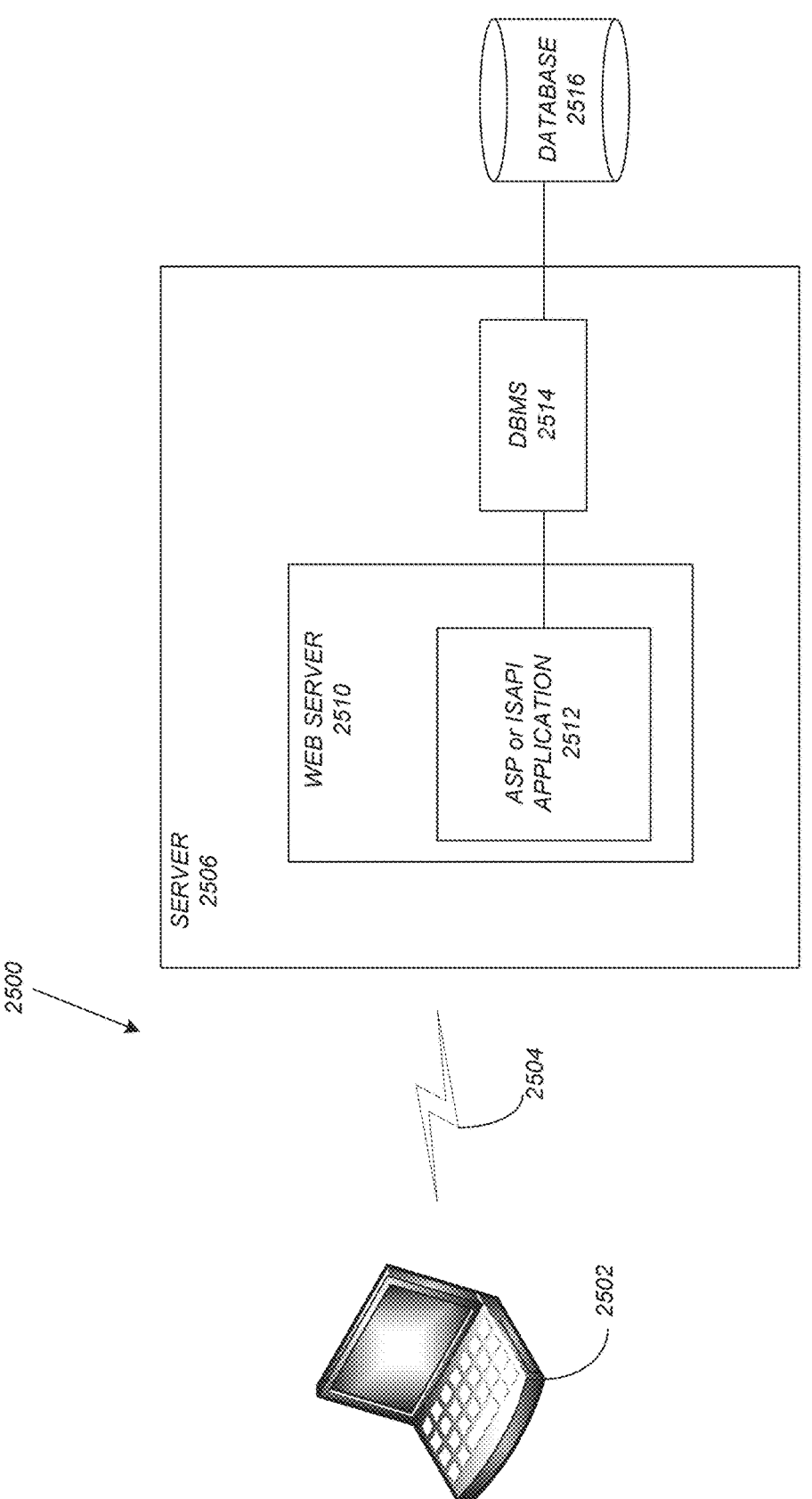
FIG. 25 schematically illustrates a typical distributed/cloud-based computer system using a network to connect client computers to server computers.

FIG. 25 schematically illustrates a typical distributed/cloud-based computer system 2500 using a network 2504 to connect client computers 2502 to server computers 2506. A typical combination of resources may include a network 2504 comprising the Internet, LANs (local area networks), WANs (wide area networks), SNA (systems network architecture) networks, or the like, clients 2502 that are personal computers or workstations (as set forth in FIG. 24), and servers 2506 that are personal computers, workstations, minicomputers, or mainframes (as set forth in FIG. 24). However, it may be noted that different networks such as a cellular network (e.g., GSM [global system for mobile communications] or otherwise), a satellite based network, or any other type of network may be used to connect clients 2502 and servers 2506 in accordance with embodiments of the invention.

A network 2504 such as the Internet connects clients 2502 to server computers 2506. Network 2504 may utilize ethernet, coaxial cable, wireless communications, radio frequency (RF), etc. to connect and provide the communication between clients 2502 and servers 2506. Further, in a cloud-based computing system, resources (e.g., storage, processors, applications, memory, infrastructure, etc.) in clients 2502 and server computers 2506 may be shared by clients 2502, server computers 2506, and users across one or more networks. Resources may be shared by multiple users and can be dynamically reallocated per demand. In this regard, cloud computing may be referred to as a model for enabling access to a shared pool of configurable computing resources.

Clients 2502 may execute a client application or web browser and communicate with server computers 2506 executing web servers 2510. Such a web browser is typically a program such as MICROSOFT INTERNET EXPLORER/ EDGE, MOZILLA FIREFOX, OPERA, APPLE SAFARI, GOOGLE CHROME, etc. Further, the software executing on clients 2502 may be downloaded from server computer 2506 to client computers 2502 and installed as a plug-in or ACTIVEX control of a web browser. Accordingly, clients 2502 may utilize ACTIVEX components/component object model (COM) or distributed COM (DCOM) components to provide a user interface on a display of client 2502. The web server 2510 is typically a program such as MICROSOFT'S INTERNET INFORMATION SERVER.

Web server 2510 may host an Active Server Page (ASP) or Internet Server Application Programming Interface (ISAPI) application 2512, which may be executing scripts. The scripts invoke objects that execute business logic (referred to as business objects). The business objects then manipulate data in database 2516 through a database management system (DBMS) 2514. Alternatively, database 2516 may be part of, or connected directly to, client 2502 instead of communicating/obtaining the information from database 2516 across network 2504. When a developer encapsulates the business functionality into objects, the system may be referred to as a component object model (COM) system. Accordingly, the scripts executing on web server 2510 (and/or application 2512) invoke COM objects that implement the business logic. Further, server 2506 may utilize MICROSOFT'S TRANSACTION SERVER (MTS) to access required data stored in database 2516 via an interface such as ADO (Active Data Objects), OLE DB (Object Linking and Embedding DataBase), or ODBC (Open Data-Base Connectivity).

Generally, these components 2500-2516 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 2502 and 2506 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 2502 and 2506. Embodiments of the invention are implemented as a software/CAD application on a client 2502 or server computer 2506. Further, as described above, the client 2502 or server computer 2506 may comprise a thin client device or a portable device that has a multi-touch-based display.

Conclusion

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

Embodiments of the invention created the following novel contributions, which previous studies haven't been able to address and achieve:

A method to generate diverse 3D geometry forms in the form of meshes, their analytical models as gbxml files and associated energy use data to build a comprehensive synthetic dataset that can train a surrogate model effectively.

Building an automated process to generate the above-mentioned dataset without manual intervention.

Demonstrating that explicit, high-level features are good predictors of EUI (energy use intensity) for variable geometries.

A method for compiling energy related data from multiple sources.

A surrogate model that is driven by synthetic dataset (that may achieve 1.3% error for a single zone and 1.9% error for five (5) climate zones).

A DYNAMO environment Zero-Touch node that offers and demonstrates real-time EUI prediction.

Further to the above, embodiments of the invention (e.g., including the use of synthetic data and machine learning) may be utilized in one or more of the following applications/fields/areas (i.e., to generate and output building operational performance analysis output in on one or more of the following fields/areas):

Solar Analysis
Daylighting (specifically)
Thermal Comfort
Embodied Carbon
Structural Analysis
Construction Cost
Constructability
Windflow analysis (Computational Fluid Dynamics)
Photovoltaic Potential
Building Program requirements
Construction scheduling
Construction work progress analysis and prediction
Crowd simulation and Shortest path finding
Computational fluid dynamics prediction
Model of fire and smoke transport
Many other analysis procedures that require large computations from geometry and parameter data but that can be closely approximated for to deliver high value and rapid results The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for generating a building operational performance analysis output comprising:

(a) synthetically algorithmically generating, in a computing system using generative design techniques, a synthetic data set comprising a set of three-dimensional (3D) building conceptual mass geometries, and wherein the synthetic data set does not represent actual building forms, wherein the generating comprises:

(i) identifying, in the computing device, two or more geometry types;

(ii) dividing, in the computing device, the two more geometry types into categories at a footprint level and a massing level;

(iii) algorithmically generating, in the computing device, the 3D building conceptual mass geometries using a separate workflow for each category, wherein the algorithmically generating utilizes the generative design techniques;

(b) generating, in the computing device, an analytical model associated with each of the 3D building conceptual mass geometries;

(c) generating, in the computing device, simulation results for each of the analytical models by conducting a simulation based on each of the analytical models;

(d) training, by the computing device, a surrogate machine learning (ML) model based on a set of features, wherein the set of features is extracted from the simulation results using ML, wherein the ML iteratively determines the set of features, and wherein the surrogate ML model replaces an execution of simulations on proposed designs to reduce computational cost and simulation runtime thereby improving a functioning of the computing device in facilitating near real-time energy evaluations, and wherein the surrogate model uses the synthetic data set to obtain designs for specific building mass geometries;

(e) receiving, in the computing device, geometry input;

(f) processing, in the computing device, the geometry input through the surrogate model to generate the building operational performance analysis output; and (g) outputting, via the computing device, the building operational performance analysis output derived from the surrogate model, to provide a real-time energy prediction service based on geometric modeling operations, wherein the real-time energy prediction service integrates energy evaluation in a geometric modeling environment, wherein the building operational performance analysis output comprises an approximate Energy Use Intensity of the geometry input.

2. The computer-implemented method of claim 1, wherein the identifying the two or more geometry types comprises:

conducting a correlational study.

3. The computer-implemented method of claim 2, wherein the correlational study comprises utilizing the set of features consisting of:

a count number of floors;

an envelope area to volume;

a total floor area to volume;

an envelope area to floor area;

a total roof area;

a total interior floor area;

a total slab on grade area;

a wall area North;

a wall area South;

a wall area East;

a wall area West;

a wall area North East;

a wall area North West;

a wall area South East; and a wall area South West.

4. The computer-implemented method of claim 2, wherein the correlational study comprises utilizing the set of features, wherein the set of features express orientation as a projected area to two directions and as a ratio to a total area.

5. The computer-implemented method of claim 1, wherein the dividing the two or more geometry types at the footprint level comprises:

dividing the two or more geometry types into convex geometry and concave geometry;

dividing the convex geometry into cyclic-polygons and non-cyclic polygons; and dividing the concave geometry into orthogonal polygons and non-orthogonal polygons.

6. The computer-implemented method of claim 5, wherein a workflow for the convex geometry cyclic-polygons comprises:

generating a footprint guiding circle, wherein the footprint guiding circle determines a position and a scale of a convex geometry cyclic polygon;

dividing the footprint guiding circle into dividers, wherein the dividers determine a count number of vertices of the convex geometry cyclic polygon;

determining a vertex density that defines a percentage of the dividers to utilize as vertices; and based on the dividers and vertex density, generating a convex hull that represents a footprint for the convex geometry cyclic polygon.

7. The computer-implemented method of claim 5, wherein a workflow for the convex geometry noncyclic-polygons comprises:

generating a point-grid, wherein the point-grid has a defined count number of grid points on an X direction and a Y direction, and wherein the point-grid determines a scale and aspect ratio of a convex geometry noncyclic polygon;

determining a vertex density that defines a percentage of the grid points to utilize as vertices; and based on the point-grid and vertex density, generating a convex hull that represents a footprint for the convex geometry noncyclic polygon.

8. The computer-implemented method of claim 5, wherein a workflow for the concave geometry orthogonal polygons comprises:

generating a point-grid, wherein the point-grid has a defined count number of grid points on an X direction and a Y direction, and wherein the point-grid determines a scale and aspect ratio of a concave geometry orthogonal polygon;

determining a vertex density that defines a percentage of the grid points to utilize as vertices;

based on the point-grid and vertex density, generating a convex hull that represents a base footprint for the concave geometry orthogonal polygon;

Manhattanizing the base footprint to generate the concave geometry orthogonal polygon, wherein the Manhattanizing comprises:

an iterator beginning at a first vertex of the vertices in the base footprint, and traversing through the vertices;

the iterator checking if a next immediate vertex of the vertices is linearly displaced or obliquely displaced, wherein:

if linearly displaced, the iterator proceeds to a next vertex; and if obliquely displaced, the iterator adds an additional Manhattan Point that is an intersection of linear extensions of a current vertex and a next vertex; and once all the Manhattan Points are added, all points are joined together with a closed polycurve that is output as a final footprint of the concave geometry orthogonal polygon.

9. The computer-implemented method of claim 5, wherein a workflow for the concave geometry non-orthogonal polygons comprises:

generating a footprint guiding circle, wherein the footprint guiding circle determines a position and a scale of a concave geometry non-orthogonal polygon;

dividing the footprint guiding circle into dividers, wherein the dividers determine a count number of vertices of the concave geometry non-orthogonal polygon;

determining a vertex density that defines a percentage of the dividers to utilize as vertices; and determining a child point density that determines a percentage of the vertices to serve as parent points that are extrapolated to sub-points as child points, wherein the child points comprise extensions of parent points to an interior of the footprint guiding circle;

determining a child point parameter that determines how much each child point is extended from the parent vertex points; and generating a polycurve by joining together the parent vertex points and the child vertex points, wherein the polycurve serves as a final footprint of the concave geometry non-orthogonal polygon.

10. The computer-implemented method of claim 1, wherein the dividing the two or more geometry types at the massing level comprises:

dividing the two more geometry types into convex geometry and concave geometry;

dividing the convex geometry into convex simple extrusion and convex variable extrusion;

dividing the convex variable tower extrusion into aligned and non-aligned;

dividing the non-aligned into convex uniform and convex non-uniform;

dividing the concave geometry into concave simple extrusion and concave variable extrusion;

dividing the concave variable extrusion into concave uniform and concave non-uniform.

11. The computer-implemented method of claim 1, wherein the separate workflows for each category are based on:

one or more modifier variables that change a nature and shape of the 3D building conceptual mass geometry and define a base case; and one or more generator variables that vary the base case into different samples and generate a new geometry in a same category.

12. The computer-implemented method of claim 1, wherein the generative design techniques:

create the synthetic dataset that is reusable using a randomize function;

create the synthetic dataset based on a feature search using a cross product function;

create the synthetic dataset based on a sensitivity analysis using a like-this function; and generate design alternatives for the synthetic dataset based on input design goals and parameters.

13. The computer-implemented method of claim 1, wherein the generating the analytical model comprises:

exporting the 3D building conceptual mass geometries as 3D geometry files;

creating a level sequence based on inputs, wherein the inputs comprise a count number of floors above ground and a floor height; and generating the analytical model based on the 3D conceptual mass geometries and the inputs.

14. The computer-implemented method of claim 1, wherein the analytical model is trained using only Manhattanized geometries.

15. A computer-implemented system for generating a building operational performance analysis output, comprising:

(a) a computer having a memory;

(b) a processor executing on the computer;

(c) the memory storing a set of instructions, wherein the set of instructions, when executed by the processor cause the processor to perform operations comprising:

(i) synthetically algorithmically generating, using generative design techniques, a synthetic data set comprising a set of three-dimensional (3D) building conceptual mass geometries, and wherein the synthetic data set does not represent actual building forms, wherein the generating comprises:

(1) identifying two or more geometry types;

(2) dividing the two more geometry types into categories at a footprint level and a massing level;

(3) algorithmically generating the 3D building conceptual mass geometries using a separate workflow for each category, wherein the algorithmically generating utilizes the generative design techniques;

(ii) generating an analytical model associated with each of the 3D building conceptual mass geometries;

(iii) generating simulation results for each of the analytical models by conducting a simulation based on each of the analytical models;

(iv) training a surrogate machine learning (ML) model based on a set of features, wherein the set of features is extracted from the simulation results using ML, wherein the ML iteratively determines the set of features, and wherein the surrogate ML model replaces an execution of simulations on proposed designs to reduce computational cost and simulation runtime thereby improving a functioning of the computer in facilitating near real-time energy evaluations, and wherein the surrogate model uses the synthetic data set to obtain designs for specific building mass geometries;

(v) receiving geometry input;

(vi) processing the geometry input through the surrogate model to generate the building operational performance analysis output; and (vii) outputting the building operational performance analysis output derived from the surrogate model, to provide a real-time energy prediction service based on geometric modeling operations, wherein the real-time energy prediction service integrates energy evaluation in a geometric modeling environment, wherein the building operational performance analysis output comprises an approximate Energy Use Intensity of the geometry input.

16. The computer-implemented system of claim 15, wherein the identifying the two or more geometry types comprises:

conducting a correlational study.

17. The computer-implemented system of claim 16, wherein the correlational study comprises utilizing the set of features consisting of:

a count number of floors;

an envelope area to volume;

a total floor area to volume;

an envelope area to floor area;

a total roof area;

a total interior floor area;

a total slab on grade area;

a wall area North;

a wall area South;

a wall area East;

a wall area West;

a wall area North East;

a wall area North West;

a wall area South East; and a wall area South West.

18. The computer-implemented system of claim 16, wherein the correlational study comprises utilizing the set of features, wherein the set of features express orientation as a projected area to two directions and as a ratio to a total area.

19. The computer-implemented system of claim 15, wherein the dividing the two or more geometry types at the footprint level comprises:

dividing the two or more geometry types into convex geometry and concave geometry;

dividing the convex geometry into cyclic-polygons and non-cyclic polygons; and dividing the concave geometry into orthogonal polygons and non-orthogonal polygons.

20. The computer-implemented system of claim 19, wherein a workflow for the convex geometry cyclic-polygons comprises:

generating a footprint guiding circle, wherein the footprint guiding circle determines a position and a scale of a convex geometry cyclic polygon;

dividing the footprint guiding circle into dividers, wherein the dividers determine a count number of vertices of the convex geometry cyclic polygon;

determining a vertex density that defines a percentage of the dividers to utilize as vertices; and based on the dividers and vertex density, generating a convex hull that represents a footprint for the convex geometry cyclic polygon.

21. The computer-implemented system of claim 19, wherein a workflow for the convex geometry noncyclic-polygons comprises:

generating a point-grid, wherein the point-grid has a defined count number of grid points on an X direction and a Y direction, and wherein the point-grid determines a scale and aspect ratio of a convex geometry noncyclic polygon;

determining a vertex density that defines a percentage of the grid points to utilize as vertices; and based on the point-grid and vertex density, generating a convex hull that represents a footprint for the convex geometry noncyclic polygon.

22. The computer-implemented system of claim 19, wherein a workflow for the concave geometry orthogonal polygons comprises:

generating a point-grid, wherein the point-grid has a defined count number of grid points on an X direction and a Y direction, and wherein the point-grid determines a scale and aspect ratio of a concave geometry orthogonal polygon;

determining a vertex density that defines a percentage of the grid points to utilize as vertices;

based on the point-grid and vertex density, generating a convex hull that represents a base footprint for the concave geometry orthogonal polygon;

Manhattanizing the base footprint to generate the concave geometry orthogonal polygon, wherein the Manhattanizing comprises:

an iterator beginning at a first vertex of the vertices in the base footprint, and traversing through the vertices;

the iterator checking if a next immediate vertex of the vertices is linearly displaced or obliquely displaced, wherein:

if linearly displaced, the iterator proceeds to a next vertex; and if obliquely displaced, the iterator adds an additional Manhattan Point that is an intersection of linear extensions of a current vertex and a next vertex; and once all the Manhattan Points are added, all points are joined together with a closed polycurve that is output as a final footprint of the concave geometry orthogonal polygon.

23. The computer-implemented system of claim 19, wherein the workflow for the concave geometry non-orthogonal polygons comprises:

generating a footprint guiding circle, wherein the footprint guiding circle determines a position and a scale of a concave geometry non-orthogonal polygon;

dividing the footprint guiding circle into dividers, wherein the dividers determine a count number of vertices of the concave geometry non-orthogonal polygon;

determining a vertex density that defines a percentage of the dividers to utilize as vertices; and determining a child point density that determines a percentage of the vertices to serve as parent points that are extrapolated to sub-points as child points, wherein the child points comprise extensions of parent points to an interior of the footprint guiding circle;

determining a child point parameter that determines how much each child point is extended from the parent vertex points; and generating a polycurve by joining together the parent vertex points and the child vertex points, wherein the polycurve serves as a final footprint of the concave geometry non-orthogonal polygon.

24. The computer-implemented system of claim 15, wherein the dividing the two or more geometry types at the massing level comprises:

dividing the two more geometry types into convex geometry and concave geometry;

dividing the convex geometry into convex simple extrusion and convex variable extrusion;

dividing the convex variable tower extrusion into aligned and non-aligned;

dividing the non-aligned into convex uniform and convex non-uniform;

dividing the concave geometry into concave simple extrusion and concave variable extrusion;

dividing the concave variable extrusion into concave uniform and concave non-uniform.

25. The computer-implemented system of claim 15, wherein the separate workflows for each category are based on:

one or more modifier variables that change a nature and shape of the 3D building conceptual mass geometry and define a base case; and one or more generator variables that vary the base case into different samples and generate a new geometry in a same category.

26. The computer-implemented system of claim 15, wherein the generative design techniques:

create the synthetic dataset that is reusable using a randomize function;

create the synthetic dataset based on a feature search using a cross product function;

create the synthetic dataset based on a sensitivity analysis using a like-this function; and generate design alternatives for the synthetic dataset based on input design goals and parameters.

27. The computer-implemented system of claim 15, wherein the generating the analytical model comprises:

exporting the 3D building conceptual mass geometries as 3D geometry files;

creating a level sequence based on inputs, wherein the inputs comprise a count number of floors above ground and a floor height; and generating the analytical model based on the 3D conceptual mass geometries and the inputs.

28. The computer-implemented system of claim 15, wherein the analytical model is trained using only Manhattanized geometries.

* * * * *